United States Patent
Dutta et al.

(10) Patent No.: US 11,367,790 B2
(45) Date of Patent: Jun. 21, 2022

(54) BODY-CONTACTED FIELD EFFECT TRANSISTORS CONFIGURED FOR TEST AND METHODS

(71) Applicant: GLOBALFOUNDRIES U.S. Inc., Malta, NY (US)

(72) Inventors: Anupam Dutta, Bangalore (IN); Balaji Swaminathan, Bangalore (IN)

(73) Assignee: GlobalFoundries U.S. Inc., Malta, NY (US)

( * ) Notice: Subject to any disclaimer, the term of this patent is extended or adjusted under 35 U.S.C. 154(b) by 427 days.

(21) Appl. No.: 16/551,794

(22) Filed: Aug. 27, 2019

(65) Prior Publication Data

US 2021/0066503 A1 Mar. 4, 2021

(51) Int. Cl.
*G01R 31/00* (2006.01)
*G01R 31/26* (2020.01)
*G01R 31/28* (2006.01)
*H01L 21/84* (2006.01)
*H01L 29/786* (2006.01)
(Continued)

(52) U.S. Cl.
CPC .... *H01L 29/78615* (2013.01); *G01R 31/2601* (2013.01); *G01R 31/2623* (2013.01); *G06F 30/367* (2020.01); *H01L 27/1203* (2013.01); *H01L 29/1079* (2013.01); *G01R 31/2621* (2013.01)

(58) Field of Classification Search
CPC ........ G01R 31/00; G01R 31/26; G01R 31/28; H01L 21/84; H01L 29/786; H01L 27/12
See application file for complete search history.

(56) References Cited

U.S. PATENT DOCUMENTS 6,387,739 B1  5/2002  Smith, III
8,524,513 B2*  9/2013  Khandelwal ........... G01R 19/00
                                                    438/18

OTHER PUBLICATIONS

Choi et al., "Analysis and Control of Floating-Body Bipolar Effects in Fully Depleted Submicrometer SOI MOSFET'S", IEEE Transactions on Electron Devices, vol. 38, No. 6, 1991, pp. 1384-1391.
(Continued)

*Primary Examiner* — Neel D Shah
(74) *Attorney, Agent, or Firm* — Gibb & Riley, LLC; Francois Pagette

(57) ABSTRACT

Test structures for a body-contacted field effect transistor (BCFET) include: a single-pad structure with body contact and probe pad regions connected to a channel region at first and second connection points with a known separation distance between the connection points; and a multi-pad structure with a body contact region connected to a channel region at a first connection point and multiple probe pad regions connected to the channel region at second connection points that are separated from the first connection point by different separation distances. A method includes: determining separation distance-dependent internal body potentials at the second connection points in response to different bias conditions by using either multiple single-pad structures, each having a different separation distance between the connection points, or by using a multi-pad structure; and based on the separation distance-dependent internal body potentials, generating a model representing the BCFET with body-contacted and floating body devices.

20 Claims, 24 Drawing Sheets

(51) Int. Cl.
*H01L 27/12* (2006.01)
*H01L 29/10* (2006.01)
*G06F 30/367* (2020.01)

(56) References Cited

OTHER PUBLICATIONS

Fenouillei-Beranger et al., "Extraction of the Main Current Components of Floating-Body Partially-Depleted SOI Devices", IEEE International SOI Conference, 2000, pp. 70-71.

* cited by examiner

BODY-CONTACTED FIELD EFFECT TRANSISTORS CONFIGURED FOR TEST AND METHODS

BACKGROUND

Field of the Invention

The present invention relates to body-contacted field effect transistors (BCFETs) and, more particularly, to test structures that enable BCFET internal body potential measurements to be acquired and employed during performance modeling.

Description of Related Art

Models for body-contacted field effect transistors (BCFETs) typically assume that certain electrical characteristics of the BCFET, such as channel conductance (Gds), drain current (Id), and higher order derivatives, will vary linearly with drain voltage (Vd). However, in some technologies (e.g., radio frequency (RF) silicon-on-insulator (SOI) technologies) the actual relationship between these electrical characteristics and the drain voltage is not linear. Specifically, in some technologies, the Gds-Vd, Id-Vd, and some other higher order derivative-Vd curves tend to exhibit a spike at some Vd particularly during low frequency operation. Therefore, there is a need in the art for test structures and methods that enable the electrical characteristics of BCFETs to be more accurately modeled.

SUMMARY

Disclosed herein are embodiments of a test structure for a body-contacted field effect transistor (BCFET). Generally, each embodiment of the test structure can include a BCFET with a source region, a drain region and a channel region positioned laterally between the source and drain regions. Specifically, the channel region can have a first side adjacent to the source region, a second side opposite the first side and adjacent to the drain region, a first end and a second end opposite the first end. In such a BCFET, the channel length is equal to the distance between the first side and the second side of the channel region and the channel width is equal to the distance between the first end and the second end. Each embodiment of the test structure can also include a body contact region and one or more probe pad regions. The body contact region can be electrically connected to a first connection point in the channel region (e.g., via a first channel link-up region) and can further be electrically isolated from the source and drain regions. The probe pad region(s) can be electrically connected to corresponding second connection point(s) in the channel region (e.g., via second channel link-up region(s)) and can further be electrically isolated from the source and drain regions.

Disclosed test structure embodiments include both single-pad test structures and multi-pad test structures. A single-pad test structure can include a single probe pad region and can be configured such that there is a known separation distance (d) between the first connection point to the body contact region and the second connection point to the probe pad region. For example, the first connection point can be at the first end of the channel region and the second connection point can be at the second end such that the separation distance between the two connection points is equal to the channel width of the BCFET. In such a single-pad test structure, the internal body potential (Vbi) of the channel region at the second connection point in response to a given set of bias conditions is measurable by connecting the probe pad region to a voltmeter. A multi-pad test structure can include a multiple probe pad regions and can be configured such that there are different known separation distances (e.g., $d_1, d_2, \ldots d_n$) between the first connection point and each of the second connection points for each of the probe pad regions. For example, the first connection point to the body contact region can be at the first end of the channel region and the second connection points to the probe pad regions can be spaced along the channel width with a last second connection point being at the second end of the channel region. In such a multi-pad test structure, the internal body potentials ($Vbi_1, Vbi_2, \ldots Vbi_n$) of the channel region at the various second connection points in response to a given set of bias conditions are measurable by connecting the probe pad regions to voltmeters.

As discussed further in the detailed description section of the specification, various optional configurations can be employed to ensure that within each test structure the probe pad region(s) is/are electrically connected to corresponding second connection point(s) in the channel region by corresponding second channel link-up region(s) and still electrically isolated from the source and drain regions.

Also disclosed herein are method embodiments that employ multiple instances of a single-pad test structure or, alternatively, a multi-pad test structure to develop an internal body potential profile for a body-contacted field effect transistor (BCFET) and to generate a performance model based on the internal body potential profile.

Specifically, one method embodiment can employ multiple instances of a single-pad test structure. As mentioned above, a single-pad test structure can include a source region, a drain region and a channel region positioned laterally between the source and drain regions. The channel region can have a first side adjacent to the source region, a second side opposite the first side and adjacent to the drain region, a first end, and a second end opposite the first end. The single-pad test structure can also include a body contact region and single probe pad region. The body contact region can be electrically connected via a first channel link-up region to a first connection point in the channel region (e.g., at the first end) and can further be electrically isolated from the source region and the drain region. The probe pad region can be electrically connected via a second channel link-up region to a second connection point in the channel region (e.g., at the second end) and can further be electrically isolated from the source region and the drain region. Within the multiple instances of the single-pad test structure that are employed in the method, the first connection point to the body contact region and the second connection point to the probe pad region can be separated by different separation distances (e.g., $d_1, d_2, \ldots d_n$). That is, each instance of the single-pad test structure can be configured so to have a specific separation distance between the first and second connection points and this specific separation distance can be different from that in the other instances of the single-pad test structure.

This method embodiment can further include applying different sets of bias conditions to each instance of the test structure in some sequence and, for each given instance of the test structure, measuring the voltage level on the probe pad region of that given instance in response to application of each specific set of bias conditions. As discussed further in the detailed description section of the specification, the voltage level on the probe pad region will be indicative of the internal body potential (Vbi) of the channel region at the second connection point in response to the specific set of bias conditions. Thus, this method embodiment can be used to acquire different internal body potentials ($Vbi_1$, $Vbi_2$, ... $Vbi_n$) at the different separation distances (e.g., $d_1$, $d_2$, ... $d_n$) associated with the different instances of the single-pad test structure and at different drain voltages ($Vd_1$, $Vd_2$, ... $Vd_x$).

Another method embodiment can employ a single instance of a multi-pad test structure. As mentioned above, the multi-pad test structure can include a source region, a drain region and a channel region positioned laterally between the source and drain regions. The channel region can have a first side adjacent to the source region, a second side opposite the first side and adjacent to the drain region, a first end, and a second end opposite the first end. The multi-pad test structure can also include a body contact region and multiple probe pad regions. The body contact region can be electrically connected via a first channel link-up region to a first connection point in the channel region (e.g., at the first end) and can further be electrically isolated from the source region and the drain region. The probe pad regions can be electrically connected via second channel link-up regions to corresponding second connection points in the channel region (e.g., spaced along the first side and the second side of the channel region between the first end and the second end) such that the first connection point and each of the second connection points are separated by different separation distances (e.g., $d_1$, $d_2$, ... $d_n$), respectively. In any case, the probe pad regions should all be electrically isolated from the source/drain regions.

This method embodiment can include applying different sets of bias conditions to the multi-pad test structure in some sequence and, for each probe pad region, measuring the voltage level on that probe pad region in response to application of each set of bias conditions. As discussed further in the detailed description section of the specification, the voltage levels on the different probe pad regions will be indicative of the internal body potentials of the channel region at the corresponding second connection points in response to a specific set of bias conditions. Thus, this method embodiment can be used to acquire different internal body potentials ($Vbi_1$, $Vbi_2$, ... $Vbi_n$) at the different separation distances (e.g., $d_1$, $d_2$, ... $d_n$) associated with the different probe pad regions of a multi-test structure and at different drain voltages ($Vd_1$, $Vd_2$, ... $Vd_x$).

Each of the method embodiments described above can further include, based on the results of the above-described measuring, developing an internal body potential (Vbi) profile for a body-contacted field effect transistor (BCFET), which indicates the expected internal body potential (Vbi) variations of the BCFET as a function of both the different first connection point to second connection point separation distances (e.g., $d_1$, $d_2$, ... $d_n$) and drain voltage variations. This internal body potential profile can subsequently be used to generate a model for predicting the electrical characteristics of the BCFET. Specifically, the model can be generated such that, within the model, the BCFET is represented by a combination of two devices and, particularly, a body-contacted device proximal to the body contact region and a floating body device that is distal to the body contact region. As discussed further in the detailed description section of the specification, alternative model options are disclosed (e.g., one where the channel widths of the body-contacted and floating body devices are independent of the bias conditions and another where the channel widths of the body-contacted and floating body devices are dependent on the bias conditions). However, in either case, the sum of the channel widths of the body-contacted and floating body devices will be equal to the total body width of the BCFET.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

As mentioned above, models for body-contacted field effect transistors (BCFETs) typically assume that some electrical characteristics (e.g., channel conductance (Gds), drain current (Id), and higher order derivatives) will vary linearly with drain voltage (Vd). However, in some technologies (e.g., radio frequency (RF) silicon-on-insulator (SOI) technologies) the actual relationship between these electrical characteristics and the drain voltage (Vd) is not linear, as discussed in greater detail below. It should be understood that, for purposes of this disclosure, all terminal voltages discussed herein (including, but not limited to, the drain voltage (Vd), the gate voltage (Vg), the body contact voltage (Vext), and the internal body voltages (Vbi) (also referred to herein as internal body potentials)) are with reference to the source voltage (Vs). Additionally, the exemplary Vd levels mentioned in this specification and shown in the Figures are normalized with respect to a maximum voltage specified for a given technology and are not intended to be limiting.

In some technologies, the Gds-Vd, Id-Vd, and some other higher order derivative-Vd curves tend to exhibit a spike at some Vd particularly during low frequency operation.

Figure 1:
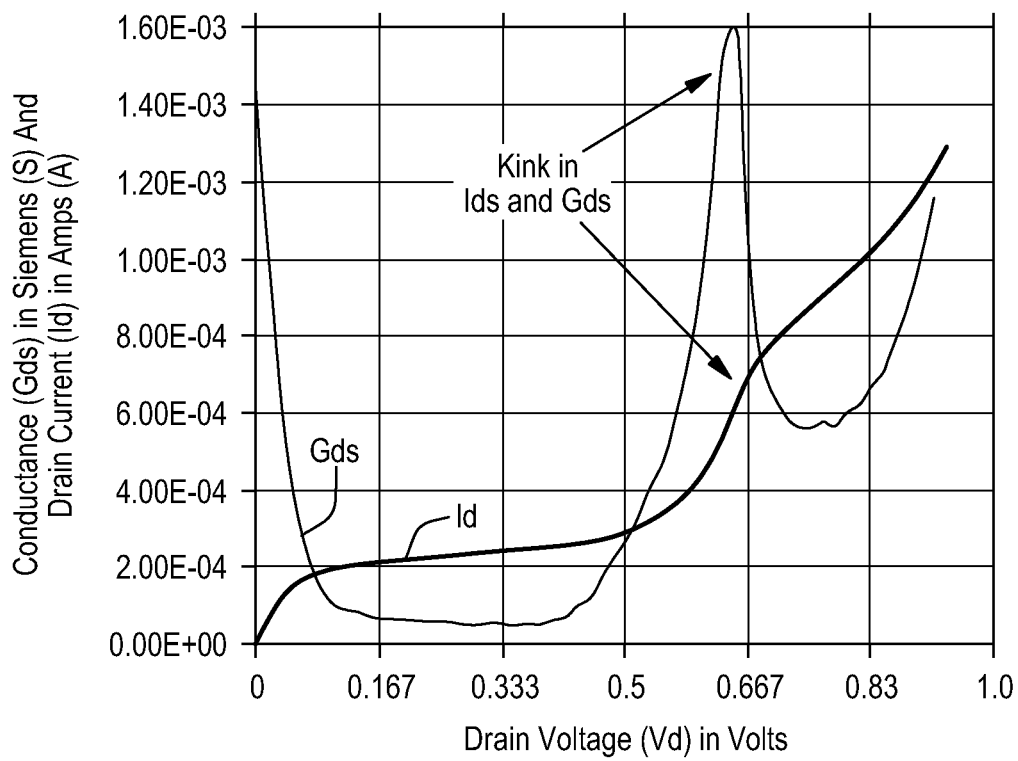
FIG. 1 is a graph illustrating kinks in Conductance (Gds)-Drain Voltage (Vd) and Drain Current (Id)-Vd curves.
Figure 2:
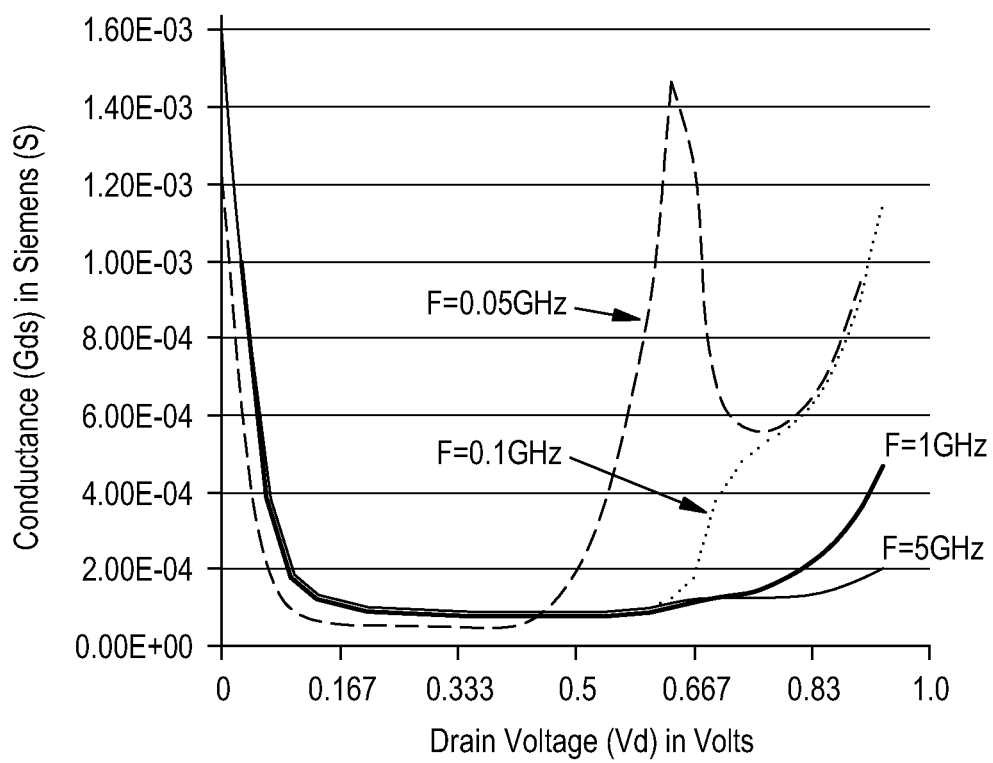
FIG. 2 is a graph illustrating disappearance of kinks in Gds-Vd curves at relatively high frequencies.

For example, as illustrated in the graph of FIG. 1, a given RF SOI BCFET may exhibit an increase in channel conductance (Gds) from approximately $1.00 \times 10^{-04}$ Siemens (S) when Vd≈0.167 volts (V) to approximately $1.20 \times 10^{-03}$ S when the Vd≈0.833V. However, an anomaly and, particularly, a kink in Gds up to $1.6 \times 10^{-03}$ S and back down may occur when Vd is in the narrow range between approximately 0.533V and 0.7V. This same RFSOI BCFET may exhibit an increase in drain current (Id) from approximately $1.00 \times 10^{-04}$ amps (A) when Vd≈0.167 volts (V) to approximately $1.30 \times 10^{-03}$ A when the Vd≈0.917V. However, an anomaly and, particularly, a kink in Id may similarly occur when Vd is in the narrow range between 0.533V and 0.7V. These kinks effectively reduce the available linear Vd range of the BCFET. As illustrated in the graph of FIG. 2, such a kink may disappear at higher frequencies. Again, it should be noted that the Vd levels mentioned above and indicated in FIGS. 1 and 2 are normalized with respect to a maximum voltage specified for a given technology. Therefore, there is a need in the art for test structures and methods that enable the electrical characteristics of BCFETs to be more accurately modeled.

Design of effective test structures and methods that will enable the electrical characteristics of BCFETs to be accurately modeled require an understanding of the root cause of the above-mentioned spikes.

Figure 3A:
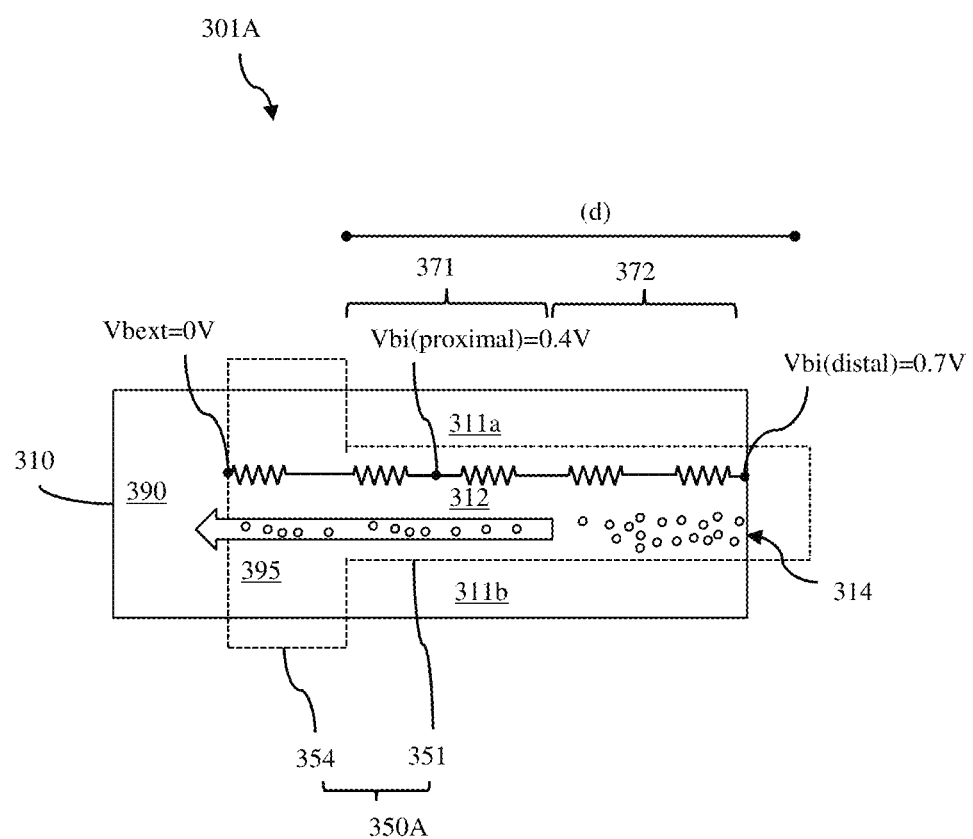
FIGS. 3A, 3B and 3C are diagrams illustrating exemplary T-gate, L-gate and H-gate body-contacted field effect transistors (BCFETs), respectively.

FIG. 3A is a diagram illustrating an exemplary T-gate N-type RF SOI BCFET 301A that includes a semiconductor body 310 (e.g., a silicon body). The semiconductor body 310 can include a plurality of doped regions including an N+ source region 311a, an N+ drain region 311b, a P– channel region 312 positioned laterally between the N+ source/drain regions 311a-311b, a P+ body contact region at one end of the channel region 312 and a P– channel link-up region extending laterally between and electrically connecting the channel region 312 and the P+ body contact. This N-type BCFET also includes a T-shaped polysilicon gate structure 350A, which overlays the semiconductor body 310 and which includes a plurality of doped portions including an N+ main portion 351 on the P– channel region 312 and a P+ extension portion 354 on the P– channel link-up region 395 perpendicular to the N+ main portion 351. The extension portion 354 can optionally have an N+ area closest to the main portion 351. It should be noted that, depending upon mask alignment during doping of the N+ source/drain regions and the P+ body contact region, the area of the extension portion 354 closest to the main portion 351 may be N-doped. For purposes of this disclosure, a "channel link-up region" refers to a doped region of a semiconductor material that provides an electrical connection between two or more adjacent regions of semiconductor material that have the same type conductivity.

The inventors of the present invention have conducted a root cause analysis of the above-mentioned Gds-Vd and Id-Vd curve spikes and determined the following. A BCFET, such as the BCFET 301A of FIG. 3, has an essentially finite body resistance irrespective of the body contact type, due to channel region 312 doping and the relatively thin thickness of the semiconductor body. The body resistance is a function of applied biases on the nodes of the BCFET and also a function the distance (d) between the connection point to the body contact region 390 (via the channel link-up region 395) and a distal point of the channel region relative to the body contact region. For devices with a relatively high channel width (W)-to-channel length (L) ratio, impact ionization (II) can result in generation of holes in the channel region 312 when the BCFET 301A is in the on-state (i.e., when the BCFET 301A is on, gate voltage (Vg) is greater than the threshold voltage (Vt) and drain voltage (Vd) is high) and gate induced drain leakage (GIDL) can result in generation of holes in the channel region 312 when the BCFET 301A is in the off-state (i.e., when the BCFET 301A is off, gate voltage (Vg) is less than 0V and drain voltage (Vd) is high). These holes can be generated along the full width of the BCFET 301A and, if not extracted, can induce "floating body effects" (FBE) when the BCFET 301A is in the on-state and can induce breakdown when the BCFET 301A is in the off-state. To avoid floating body effects and breakdown, holes can be extracted either through the body contact region 390 or by forward biasing the source-body (S-B) junction. However, extraction of holes through the body contact region 390 is dependent upon the distance between to the body contact region. That is, holes in the area of the channel region proximal to the body contact region 390 can be extracted through the body contact region 390, but, due to higher resistance, holes in the area of the channel region 312 distal may not be extracted through the body contact region 390 and, thus, may build up in the area of the channel region 312 distal to the body contact region 390. When this build up of holes 314 occurs, a localized increase in the internal body potential (Vbi) and, thereby localized floating body effects (FBEs) are observed until the S-B junction is strongly forward biased. In other words, the section 371 of the BCFET proximal to the body contact region 390 effectively functions as a body-contacted device and the section 372 of the BCFET distal to the body contact region 390 effectively functions as a floating body (FB) device.

As mentioned above the BCFET 301A of FIG. 3A is referred to as a T-gate BCFET due to the T-shaped polysilicon gate structure 350A. Those skilled in the art will recognize that other BCFET configurations (e.g., L-gate BCFETs, H-gate BCFETs, etc.) can similar suffer from such floating body effects.

Figure 3B:
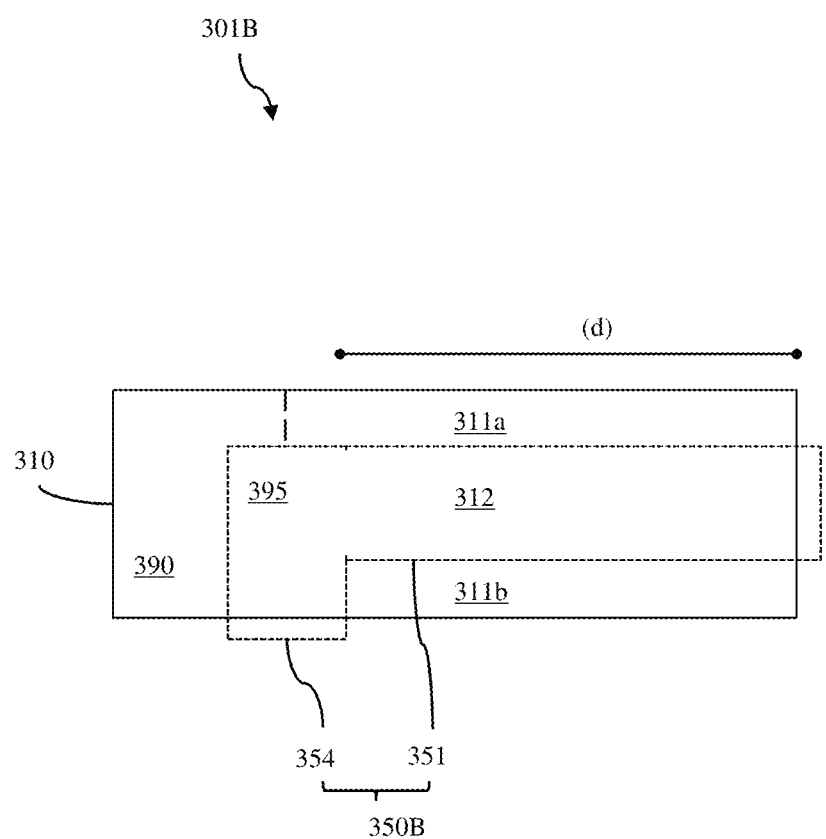

For example, FIG. 3B is a diagram illustrating an exemplary L-gate N-type BCFET 301C, which is configured essentially the same as the T-gate BCFET 301A except that it includes an L-shaped polysilicon gate structure 350B as opposed to the T-shaped polysilicon gate structure. In this case, however, the body contact region 390 may be shorted to the source region 311a by a silicide layer formed during processing on the top surface of the semiconductor body 310 above the interface between the body contact region 390 and the source region 311a. In any case, for essentially the same reasons as set out above with regard to the T-gate BCFET 301A, such an L-gate BCFET 301B may exhibit a localized increase in internal body potential (Vbi) at the distal end of the channel region 312 farthest from the connection to the body contact region 390 (via the channel link-up region 395) and, thus, may exhibit localized floating body effects (FBEs) at that distal end.

Figure 3C:
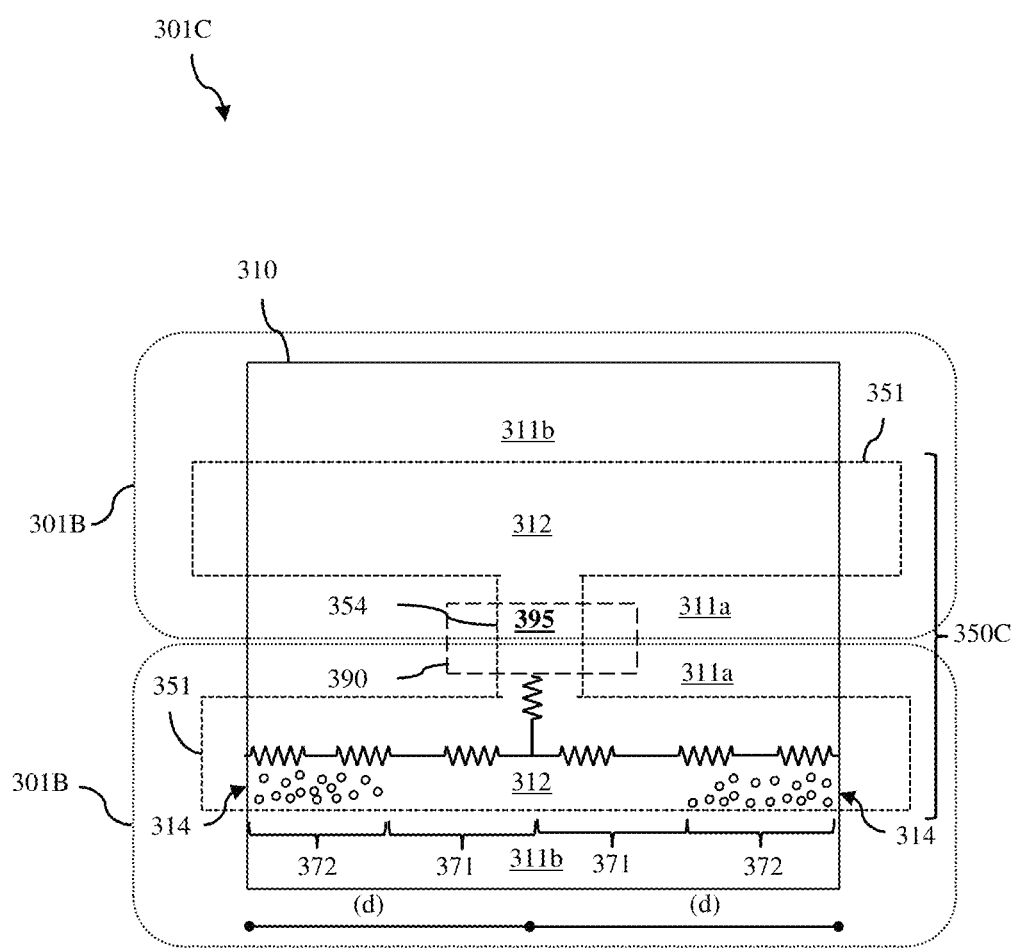

FIG. 3C is a diagram illustrating an exemplary pair of adjacent H-gate N-type BCFETs 301C where the body contact region 390, channel link-up region 395 and extension portion 354 of the gate structure are shared between the BCFETs 301C and located approximately at the midline of the devices (as opposed to being at one end). More specifically, the doped regions for the BCFETs 301C can be within a semiconductor body 310 and can include, for each BCFET 301C, a N+ source region 311a, an N+ drain region 311b and a P− channel region 312 positioned laterally between the source region 311a and the drain region 311b. Instead of discrete source regions there can be a single N+ source region 311a that is shared between the two BCFETs 301C such that the BCFETs 301C are connected in series. Additionally, the BCFETs 301C can have a shared H-shaped polysilicon gate structure 350C with parallel N+ main portions 351 aligned above the respective channel regions 312 of the BCFETs 301C and a P+ extension portion 354 that is perpendicular to and extends laterally between the main portions 351 (i.e., traversing the shared source region 311a) at approximately the midline of the devices. Within the semiconductor body 310, there can also be a channel link-up region 395, which is aligned below the extension portion 354 and in contact with the channel regions 312 of the two BCFETs 301C, and a shared P+ body contact region 390, which is on at least one side of the extension portion 354 of the gate structure and which is bordered by the shared source region 311a. The body contact region 390 can be shorted to the source region 311a by a silicide layer on the top surface of the semiconductor body 310 above the interface between the body contact region 390 and the shared source region 311a. In any case, for essentially the same reasons as set out above with regard to the T-gate BCFET 301A, such an H-gate BCFET 301C, can exhibit localized increases in internal body potential (Vbi) and, thereby localized floating body effects (FBEs). In this case, because the body contact region 390 is connected at the midline (as opposed to at only one end), an accumulation of holes 314 can occur at both outer ends of the channel region 312. Sections 371 of the BCFET on either side and proximal to the connection point to the body contact region 390 effectively function as body-contacted devices and the sections 372 of the BCFET again on either side but distal to the connection point to the body contact region 390 effectively function as floating body (FB) devices.

Those skilled in the art will recognize in the case of a P-type BCFET, a build up of electrons (as opposed to holes) can occur in the area of the channel region distal to the body contact region in any of the BCFET configurations described above (e.g., T-gate, L-gate or H-gate), thereby similarly cause FBE in the section of the P-type BCFET distal to the body contact region.

In view of the foregoing, disclosed herein are embodiments of single-pad and multi-pad test structures for a body-contacted field effect transistor (BCFET) and embodiments of a method that employs one or more of these test structures. Each embodiment of the single-pad test structure is configured so as to have a body contact region, which is electrically connected to a first connection point in a channel region, and a single probe pad region, which is electrically connected to a second connection point in the channel region and which is separated from the first connection point by some specific separation distance (e.g., a separation distance equal to the full channel width). Each embodiment of the multi-pad test structure is configured so as to have a body contact region, which is electrically connected to a first connection point in a channel region, and multiple probe pad regions, which are electrically connected to corresponding second connection points that are in the channel region and separated from the first connection point by different separation distances (e.g., different separation distances up to a maximum separation distance equal to the full channel width). Method embodiments include providing multiple instances of a single-pad test structure, where each instance has a different separation distance between the first and second connection points or, alternatively, a multi-pad test structure. The method embodiments further include using the test structure(s) in order to determine separation distance-dependent internal body potentials at the second connection points in response to different sets of bias conditions (e.g., by connected the probe pad regions to voltmeters). Referring again to the discussion of FIG. 3 above, given the build up of holes 314 that can occur in the area of the channel region 312 distal to the body contact region 390 in the on-state due to impact ionization (II) or in the off-state due to gate-induced drain leakage (GIDL), the separation distance-dependent internal body potential measurements taken from the test structure(s) can subsequently be employed to generate a model, which represents a BCFET with a relatively wide channel width using a combination of a body-contacted device to characterize the electrical behavior of the BCFET in the area proximal to the body contact region and a floating body device to characterize the electrical behavior of the BCFET in the area distal to the body contact region.

More particularly, referring to FIGS. 4, 5, 6, 7, 8 and 9, disclosed herein are embodiments of a test structure 400, 500, 600, 700, 800 and 900, respectively. Generally, each embodiment of the test structure 400, 500, 600, 700, 800, 900 includes a body-contacted field effect transistor (BCFET) 401, 501, 601, 701, 801, 901. For purposes of illustration, the BCFETs 401, 501, 601, 701, 801, 901 are shown in the figures and described below as being T-gate BCFETs. However, it should be understood that the figures are not intended to be limiting and that the key features of the disclosed embodiments could be employed with respect to other BCFET configurations, such as L-gate BCFETs, H-gate BCFETs or any other suitable type of BCFET.

In any case, the BCFET 401, 501, 601, 701, 801, 901 includes a monocrystalline semiconductor body 410, 510, 610, 710, 810, 910 (e.g., a silicon body). The semiconductor body can be on an insulator layer (e.g., a silicon dioxide layer or other suitable insulator layer) above a semiconductor substrate. Alternatively, the semiconductor body can be a semiconductor shape patterned into an upper portion of a bulk semiconductor substrate (e.g., a bulk silicon substrate). Isolation regions 405, 505, 605, 705, 805, 905 (e.g., shallow trench isolation (STI) regions) can laterally surround the semiconductor body 410, 510, 610, 710, 810. For example, STI regions can be on the insulator layer positioned laterally adjacent to sidewalls of the semiconductor body. The patterned shape of the semiconductor body can vary, as discussed in greater detail below with regard to specific embodiments.

The semiconductor body 410, 510, 610, 710, 810, 910 can include multiple doped regions.

The doped regions of the semiconductor body 410, 510, 610, 710, 810, 910 can include, within an active device region of the semiconductor body, a source region 411a, 511a, 611a, 711a, 811a, 911a; a drain region 411b, 511b, 611b, 711b, 811b, 911b; and a channel region 412, 512, 612, 712, 812, 912 positioned laterally between the source and drain regions. Specifically, the channel region 412, 512, 612, 712, 812, 912 can have a first side adjacent to the source region 411a, 511a, 611a, 711a, 811a, 911a, a second side opposite the first side and adjacent to the drain region 411b, 511b, 611b, 711b, 811b, 911b, a first end and a second end opposite the first end. In such a BCFET 401, 501, 601, 701, 801, 901, the channel length is equal to the distance between the first side and the second side of the channel region 412, 512, 612, 712, 812, 912 and the channel width is equal to the distance between the first end and the second end. The channel region 412, 512, 612, 712, 812, 912 can have a first type conductivity at a relatively low conductivity level and the source/drain regions 411a-b, 511a-b, 611a-b, 711a-b, 811a-b, 911a-b can have a second type conductivity at a relatively high conductivity level. For example, in the case of an N-type BCFET, the channel region 412, 512, 612, 712, 812, 912 can have P− conductivity and the source/drain regions 411a-b, 511a-b, 611a-b, 711a-b, 811a-b, 911a-b can have N+ conductivity; whereas, in the case of a P-type BCFET, the channel region 412, 512, 612, 712, 812, 912 can have N− conductivity and the source/drain regions 411a-b, 511a-b, 611a-b, 711a-b, 811a-b, 911a-b can have P+ conductivity.

The doped regions of the semiconductor body 410, 510, 610, 710, 810, 910 can also include a body contact region 490, 590, 690, 790, 890, 990 and a first channel link-up region 495, 595, 695, 795, 895, 995, which electrically connects the body contact region 490, 590, 690, 790, 890, 990 to the channel region 412, 512, 612, 712, 812, 912 at a first connection point 471, 571, 671, 771, 871, 971 in the channel region (e.g., at the first end of the channel region). The body contact region 490, 590, 690, 790, 890, 990 can have the first type conductivity at a relatively high conductivity level and the first channel link-up region 495, 595, 695, 795, 895, 995 can have the first type conductivity at a relatively low conductivity level. Thus, for example, in the case of an N-type BCFET, the body contact region 490, 590, 690, 790, 890, 990 can have P+ conductivity and the first channel link-up region 495, 595, 695, 795, 895, 995 can have P− conductivity; whereas, in the case of a P-type BCFET, the body contact region 490, 590, 690, 790, 890, 990 can have N+ conductivity and the first channel link-up region 495, 595, 695, 795, 895, 995 can have N− conductivity. It should be noted that the first connection point 471, 571, 671, 771, 871, 971 can be at the first end of the channel region (e.g., in the case of a T-gate BCFET, as illustrated, or in the gate of an L-gate BCFET). Alternatively, the first connection point 471, 571, 671, 771, 871, 971 could be at some other suitable location given the specific BCFET design (e.g., at the midline of the channel region between the first end and the second end and on either the first side or the second side, as in the case of an H-gate BCFET).

The doped regions of the semiconductor body 410, 510, 610, 710, 810, 910 can further include one or more probe pad region(s) 480, 580, 680, $780_1$-$780_n$, $880_1$-$880_n$, $980_1$-$980_n$ and corresponding second channel link-up region(s) 485, 585, 685, $785_1$-$785_n$, $885_1$-$885_n$, $980_1$-$985_n$, which electrically connect the probe pad region(s) 480, 580, 680, $780_1$-$780_n$, $880_1$-$880_n$, $980_1$-$980_n$ to the channel region at corresponding second connection point(s) 472, 572, 672, $772_1$-$772_n$, $872_1$-$872_n$, $972_1$-$972_n$, respectively, in the channel region 412, 512, 612, 712, 812, 912. Specifically, the test structures disclosed herein include both single-pad test structures 400, 500, 600 (see FIGS. 4, 5, 6) and the multi-pad test structures 700, 800, 900 (see FIGS. 7, 8, 9).

Figure 4:
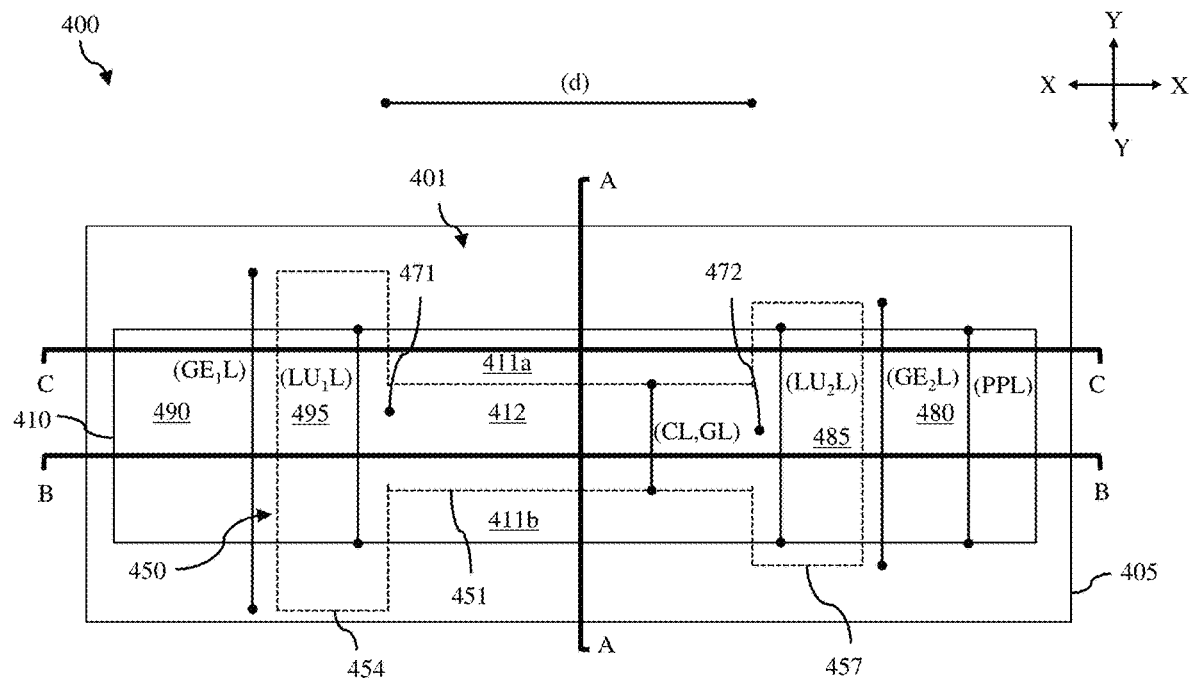
FIGS. 4, 5, and 6 are diagrams of different BCFET single-pad test structures, respectively.
Figure 5:
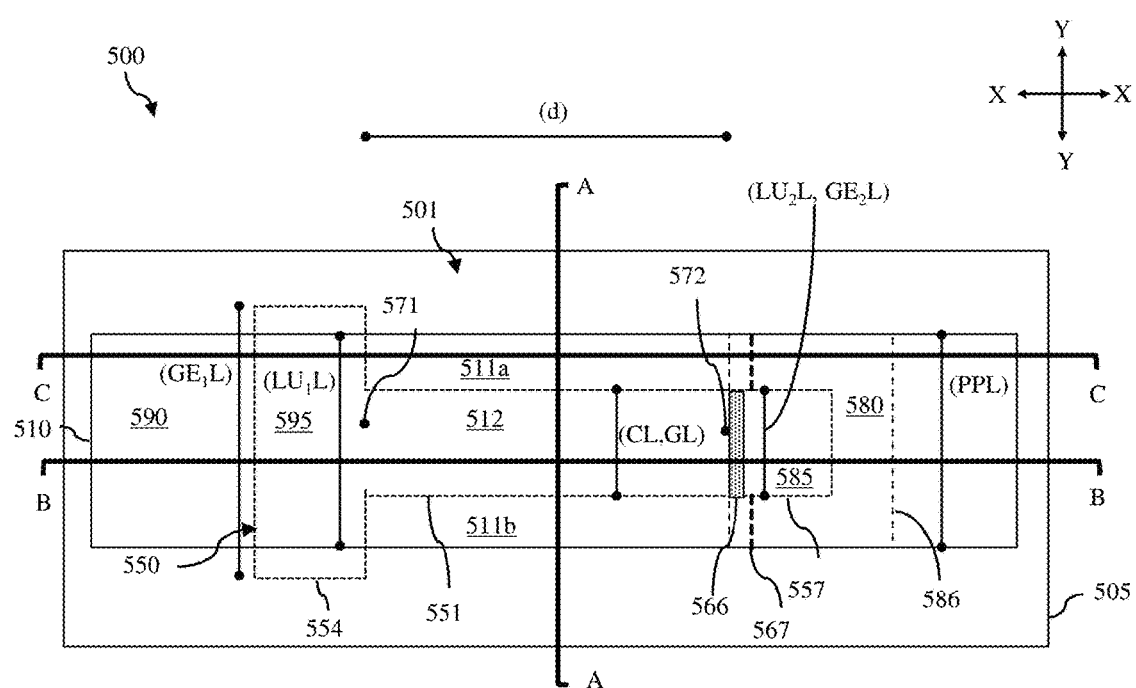
Figure 6:
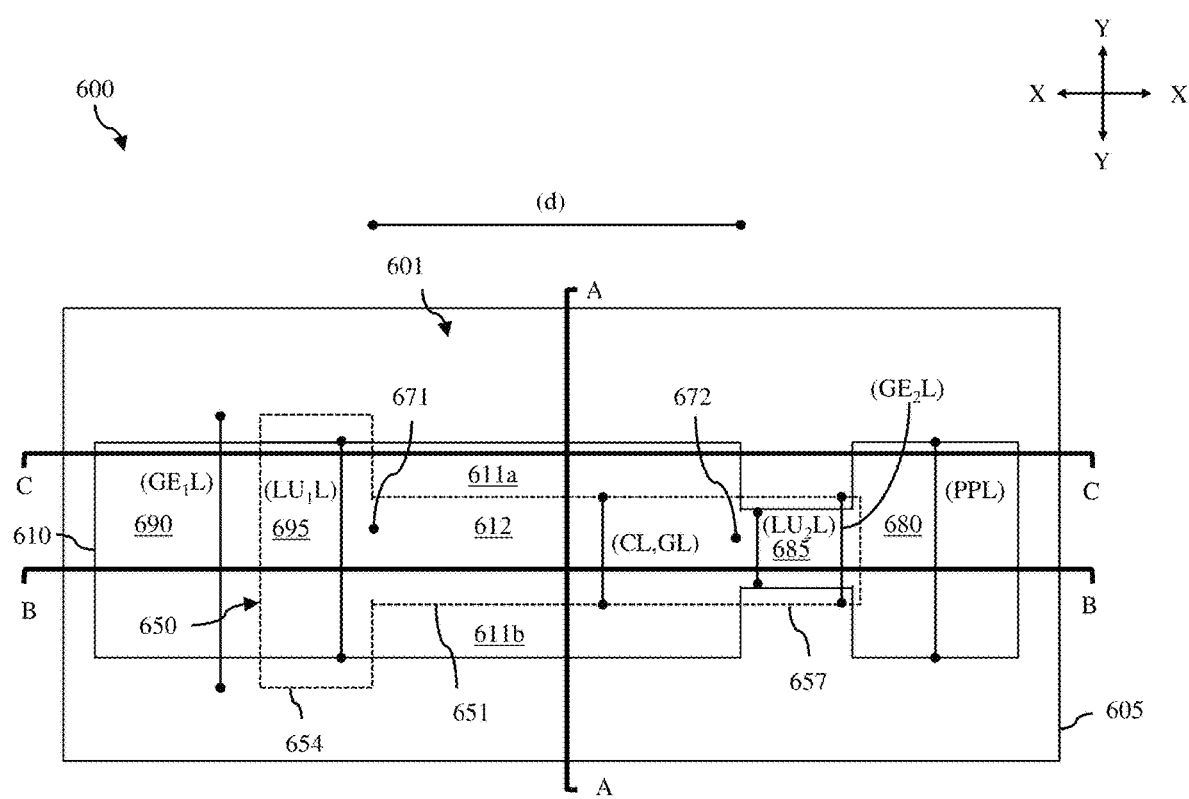

Referring specifically to FIGS. 4, 5 and 6, in single-pad test structures 400, 500, 600, the semiconductor body 410, 510, 610 includes a single probe pad region 480, 580, 680 and corresponding second channel link-up region 485, 585, 685, which electrically connects the single probe pad region 480, 580, 680 to the channel region 412, 512, 612 at a second connection point 472, 572, 672 that is separated from the first connection point 471, 571, 671 to the first channel link-up region (and, thus, the body contact region 490, 590, 690) by a known separation distance (d). This known separation distance (d) can, for example, be the maximum possible separation distance between the first and second connection points. Thus, if the first connection point 471, 571, 671 to first channel link-up region (and thereby the body contact region 490, 590, 690) is at the first end of the channel region 412, 512, 612, the second connection point 472, 572, 672 to the second channel link-up region (and, thus, the probe pad region 480, 580, 680) can be at the second end of the channel region opposite the first end such that the separation distance (d) between the two connection points is equal to the full channel width of the BCFET 401, 501, 601, as in the case of a T-gate BCFET, as illustrated, or an L-gate BCFET. Alternatively, the second connection point 472, 572, 672 could be at some other suitable location given the specific BCFET design. For example, when the first connection point is a midline first connection point between the first end and the second end, as in the case of an H-gate BCFET, the second connection point could be at one end of the channel region.

Figure 8:
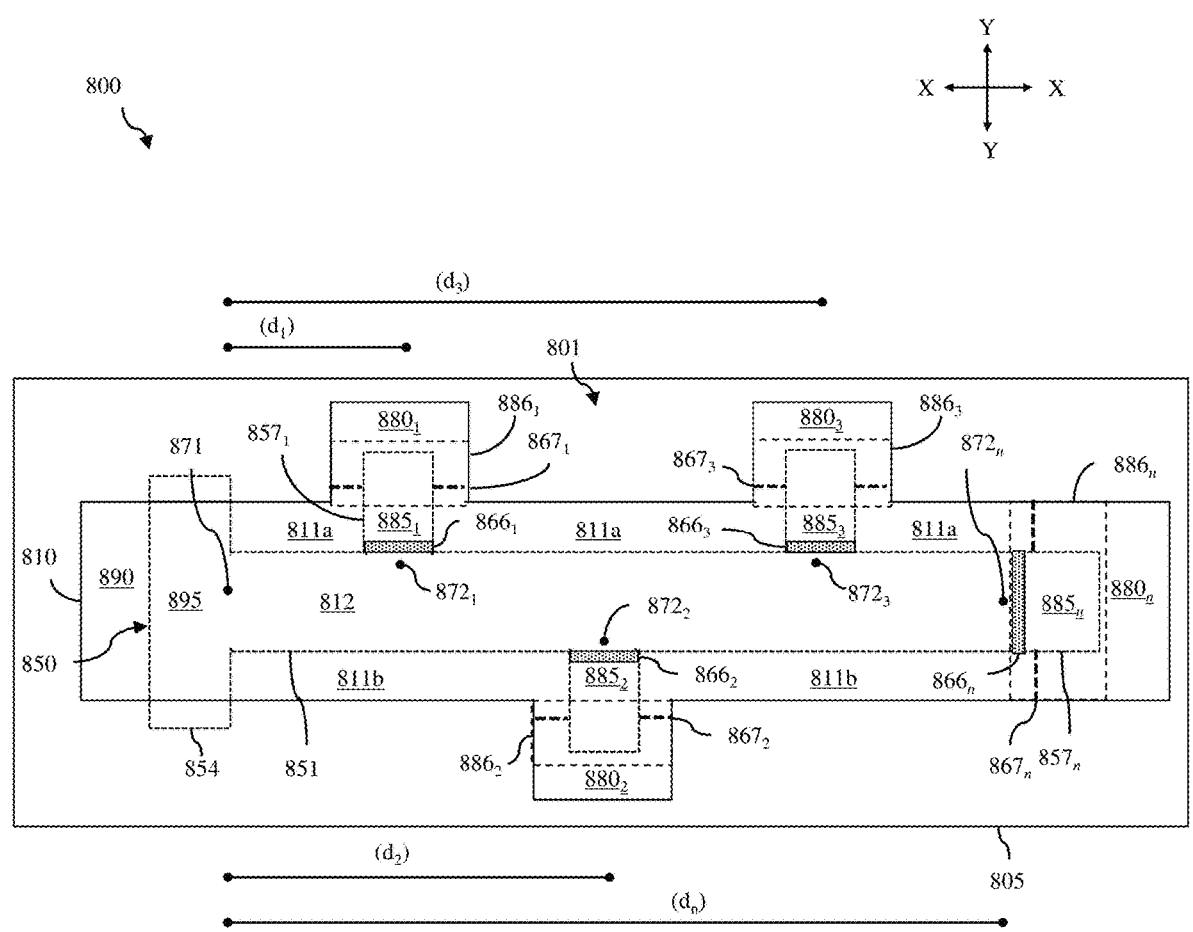
Figure 9:
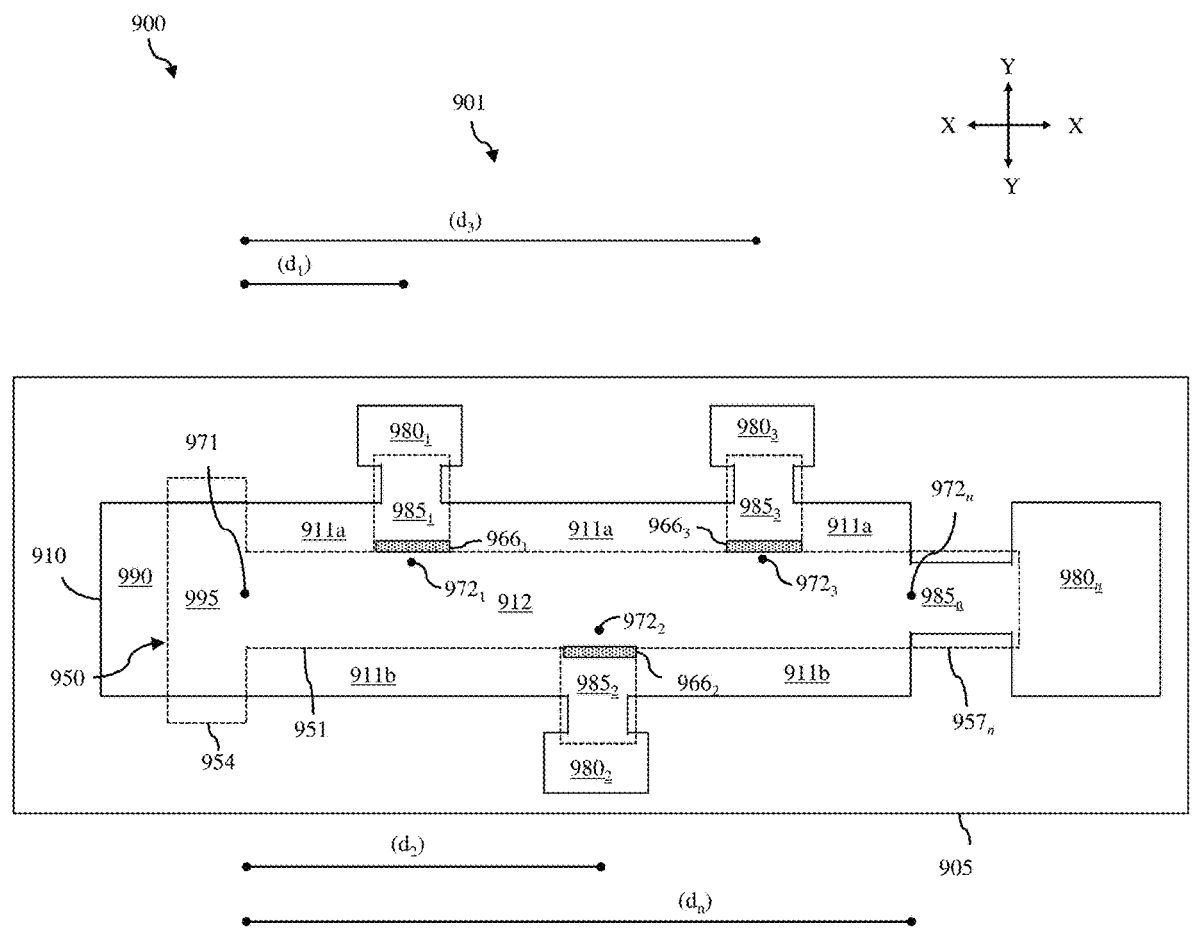

Referring specifically to FIGS. 6, 8 and 9, in multi-pad test structures 700, 800, 900, the semiconductor body 710, 810, 910 includes multiple probe pad regions $780_1$-$780_n$, $880_1$-$880_n$, $980_1$-$980_n$ and corresponding second channel link-up regions $785_1$-$785_n$, $885_1$-$885_n$, $985_1$-$985_n$, which electrically connect the probe pad regions $780_1$-$780_n$, $880_1$-$880_n$, $980_1$-$980_n$ to the channel region 712, 812, 912 at corresponding second connection points $772_1$-$772_n$, $872_1$-$872_n$, $972_1$-$972_n$, respectively, that are separated from the first connection point 771, 871, 971 to the first channel link-up region (and thereby to the body contact region 790, 890, 990) by different known separation distances $(d_1)$-$(d_n)$. The second connection points $772_1$-$772_n$, $872_1$-$872_n$, $972_1$-$972_n$ (and, thus, the second channel link-up regions $785_1$-$785_n$, $885_1$-$885_n$, $985_1$-$985_n$ and probe pad regions $780_1$-$780_n$, $880_1$-$880_n$, $980_1$-$980_n$, respectively) can be spaced along the channel width with successive ones of the second connection points (and, thus, successive ones of the second channel link-up regions and corresponding probe pad regions) being at opposite sides of the channel region with the last second connection point $772_n$, $872_n$, $972_n$ with the maximum separation distance $(d_n)$ to the first connection point 771, 871, 971 being at the second end of the channel region 712, 812, 912 (i.e., opposite the first connection point), as in the case of a T-gate BCFET, as illustrated, or in the case of an L-gate BCFET. Alternatively, the second connection points $772_1$-$772_n$, $872_1$-$872_n$, $972_1$-$972_n$ could be at some other suitable locations given the specific BCFET design. For example, when the first connection point is a midline first connection point between the first end and the second end, as in the case of an H-gate BCFET, the second connection points could be spaced along the channel width to one or both sides of the midline first connection point with at least one second connection point being at one of the ends of the channel region, as in the case of an H-gate BCFET.

Referring again to FIGS. 4, 5, 6, 7, 8 and 9, in each of the embodiments of the test structure 400, 500, 600, 700, 800 and 900, the probe pad region(s) 480, 580, 680, $780_1$-$780_n$, $880_1$-$880_n$, $980_1$-$980_n$ can have the first type conductivity at a relatively high conductivity level and the second channel link-up region(s) 485, 585, 685, $785_1$-$785_n$, $885_1$-$885_n$, $985_1$-$985_n$ can also have the first type conductivity, but at a relatively low conductivity level. Thus, for example, in the case of an N-type BCFET, the probe pad region(s) 480, 580, 680, $780_1$-$780_n$, $880_1$-$880_n$, $980_1$-$980_n$ can have P+ conductivity and the second channel link-up region(s) 485, 585, 685, $785_1$-$785_n$, $885_1$-$885_n$, $980_1$-$985_n$ can have P− conductivity; whereas, in the case of a P-type BCFET, the probe pad region(s) 480, 580, 680, $780_1$-$780_n$, $880_1$-$880_n$, $980_1$-$980_n$ can have N+ conductivity and the corresponding second channel link-up region(s) 485, 585, 685, $785_1$-$785_n$, $885_1$-$885_n$, $980_1$-$985_n$ can have N− conductivity.

The BCFET 401, 501, 601, 701, 801, 901 can further include a gate structure 450, 550, 650, 750, 850, 950 on the semiconductor body 410, 510, 610, 710, 810, 910. This gate structure 450, 550, 650, 750, 850, 950 can include a gate stack of at least a thin gate dielectric layer and a gate conductor layer on the gate dielectric layer. The gate stack can have a defined shape that includes: a main portion 451, 551, 651, 751, 851, 951, which is adjacent to the channel region 412, 512, 612, 712, 812, 912 (i.e., which overlays the channel region from the first side to the second side and also from the first end to the second end); a first extension portion 454, 554, 654, 754, 854, 954, which overlays the first channel link-up region 495, 595, 695, 795, 895, 995 to the body contact region 490, 590, 690, 790, 890, 990; and second extension portion(s) 457, 557, 657, $757_1$-$757_n$, $857_1$-$857_n$, $957_1$-$957_n$, which overlay the second channel link-up region(s) 485, 585, 685, $785_1$-$785_n$, $885_1$-$885_n$, $985_1$-$985_n$ to the probe pad region(s) 480, 580, 680, $780_1$-$780_n$, $880_1$-$880_n$, $980_1$-$980_n$.

The gate dielectric layer can, for example, be a silicon dioxide gate dielectric layer. The gate conductor layer can, for example, be a gate polysilicon layer. In the main portion 451, 551, 651, 751, 851, 951 the gate polysilicon layer can be doped so as to have the second type conductivity at a relatively high conductivity level. That is, for an N-type BCFET, the gate polysilicon layer of the main portion can be doped so as to have N+ conductivity; whereas, for a P-type BCFET, the gate polysilicon layer of the main portion can be doped so as to have P+ conductivity. The gate polysilicon layer for the first extension portion 454, 554, 654, 754, 854, 954 and the second extension portion(s) 457, 557, 657, $757_1$-$757_n$, $857_1$-$857_n$, $957_1$-$957_n$ of the gate structure 450, 550, 650, 750, 850, 950 can be doped so as to have the first type conductivity at a relatively high conductivity level. That is, for an N-type BCFET, the gate polysilicon layer of the extension portions can be doped so as to have P+ conductivity; whereas, for a P-type BCFET, the gate polysilicon layer of the extension portions can be doped so as to have N+ conductivity. It should be noted that, during manufacturing of the test structures, masked dopant implantation processes are performed to dope the P+ and N+ regions of the semiconductor body and, concurrently, the gate poly silicon layer in the different portions. Additionally, due to mask alignment issues during these dopant implantation processes, the gate polysilicon layer of the first extension portion 454, 554, 654, 754, 854, 954 and/or the second extension portion(s) 457, 557, 657, $757_1$-$757_n$, $857_1$-$857_n$, $957_1$-$957_n$ may have a proximal section (closest to the channel region) with the second type conductivity at a relatively high conductivity level and a distal section (farthest from the channel region, closest to the body contact/probe pad) with the first type conductivity at a relatively high conductivity level.

Alternatively, the gate structure 450, 550, 650, 750, 850, 950 could be a replacement metal gate (RMG) structure where the gate dielectric layer is, for example, a high K gate dielectric layer and the gate conductor layer includes one or more gate metal layers (e.g., one or more work function metal layer(s) and a conductive fill material layer on the work function metal layer(s)). It should be noted that the same gate metal materials could be used in the main portion 451, 551, 651, 751, 851, 951, the first extension portion 454, 554, 654, 754, 854, 954 and the second extension portion(s) 457, 557, 657, $757_1$-$757_n$, $857_1$-$857_n$, $957_1$-$957_n$.

Those skilled in the art will recognize that a high-K gate dielectric layer refers to a gate dielectric layer made of a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). For an N-type BCFET, the work function metal can be an N-type work function metal, whereas, for a P-type BCFET, the work function metal can be a P-type work function metal. The optimal gate conductor work function of NFETs can be, for example, between 3.9 eV and about 4.2 eV. Exemplary N-type work function metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for PFETs can be, for example, between about 4.9 eV and about 5.2 eV. Exemplary P-type work function metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The conductive fill material layer can be a fill metal or fill metal alloy, such as tungsten, a tungsten alloy (e.g., tungsten silicide or titanium tungsten), cobalt, aluminum or any other suitable fill metal or fill metal alloy.

In at least some of the embodiments, the gate structure can further include one or more gate cut isolation regions. For example, see the gate cut isolation region 566 in the gate structure 550 of FIG. 5, the gate cut isolation regions $766_1$-$766_3$ in the gate structure 750 of FIG. 7, the gate cut isolation regions $866_1$-$866_n$ in the gate structure 850 of FIG. 8, and the gate cut isolation regions $966_1$-$966_3$ in the gate structure 950 of FIG. 9. Each of the above-mentioned gate cut isolation regions 566, $766_1$-$766_3$, $866_1$-$866_n$, $966_1$-$966_3$ electrically isolates the main portion 551, 751, 851, 951 of the gate structure 550, 750, 850, 950 from a corresponding second extension portion 557, $757_1$-$757_3$, $857_1$-$857_n$, $957_1$-$957_3$ in order to prevent biasing of that corresponding second extension portion when the main portion 551, 751, 851, 951 is biased. Such gate cut isolation regions are employed when biasing the second extension portion of the gate structure above the threshold voltage (Vt) would create a conducting channel (i.e., channel inversion after depletion region formation from the gate side) that traverses the portion of the second channel link-up region directly below the second gate extension in a direction that is essentially perpendicular to the electrical connection between the channel region and the probe pad region, thereby blocking the electrical connection between the channel region and the probe pad region (i.e., electrically cutting off the conducting path between the channel region and the probe pad region).

Figure 7:
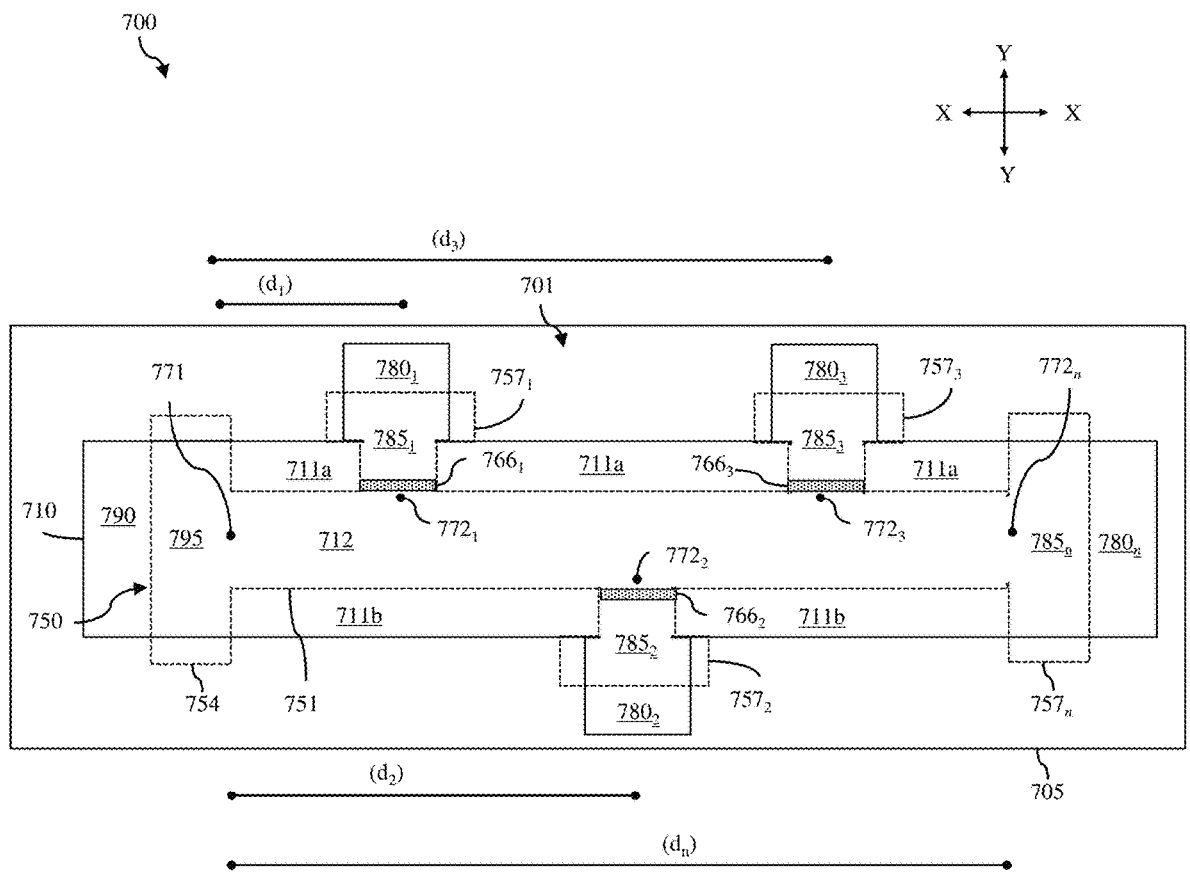
FIGS. 7, 8, and 9 are diagrams of different BCFET multi-pad test structures, respectively.

For example, consider the gate structures 750 and 950 of the test structures 700 and 900 shown in FIGS. 7 and 9, respectively. The gate structure 750, 950 includes second extension portions $757_1$-$757_3$, $957_1$-$957_3$ that are on opposing sides of the main portion 751, 951 above second channel link-up regions $785_1$-$785_3$, $985_1$-$985_3$. Each of these second channel link-up regions $785_1$-$785_3$, $985_1$-$985_3$ has the first type conductivity and, thus, can electrically connect the channel region 712, 912 to the probe pad regions $780_1$-$780_3$, $980_1$-$980_3$, which also have the first type conductivity. However, each of the second channel link-up regions $785_1$-$785_3$, $985_1$-$985_3$ is also positioned laterally between either adjacent source regions 711*a*, 911*a* or adjacent drain regions 711*b*, 911*b*, which have the second type conductivity, such that if the second extension portions $757_1$-$757_3$, $957_1$-$957_3$ of the gate structure 750, 950 are biased, conducting channels would be created through these second channel link-up regions $785_1$-$785_3$, $985_1$-$985_3$ between the adjacent source or drain regions, thereby blocking the electrical connections between the channel region 712, 912 and the probe pad regions $780_1$-$780_3$, $980_1$-$980_3$. Thus, the gate structure 750, 950 also includes gate cut isolation regions $766_1$-$766_3$, $966_1$-$966_3$ between the main portion 751, 951 and the second extension portions $757_1$-$757_3$, $957_1$-$957_3$ on the sides of the main portion in order to prevent biasing. For essentially the same reason, the test structure 800 of FIG. 8 includes gate cut isolation regions $866_1$-$866_3$ between the main portion 851 and the second extension portions $857_1$-$857_3$ on the opposing sides of the main portion 851.

It should be noted that no gate cut isolation regions would be required at the opposing ends of the main portion 751, 951 of the gate structure 750, 950 in the test structure 700, 900. This is because neither first channel link-up region 795, 995, which is aligned below the first extension portion 754, 954 of the gate structure, nor the second channel link-up region $785_n$, $985_n$, which is at the opposite end of the gate structure and which is aligned below the second extension portion $757_n$, $957_n$ of the gate structure, are positioned laterally between regions with the second type conductivity. Thus, biasing these extension portions would not result in a conducting channel that blocks the link-up to the channel region. For essentially the same reason, the test structures 400 and 600 of FIGS. 4 and 6 do not include gate cut isolation regions at the the opposing ends of the main portions 451 and 651.

It should also be noted that in the test structures 500 of FIG. 5 and 800 of FIG. 8, the gate structure 550, 850 does not include a gate cut isolation region between the main portion 551, 851 and the first extension portion 554, 854. This is because the first channel link-up region 595, 895, which is below the first extension portion 554, 854 and which has the first type conductivity, is not positioned laterally between regions with the second type conductivity and, thus, biasing the first extension portion would not result in a conducting channel that blocks the link-up between the channel region and the body contact region. However, the gate structures 550, 850 each include a gate cut isolation region 566, $866_n$ between the opposite end of the main portion 551, 851 of the gate structure and second extension portion 557, $857_n$. Specifically, during processing mask alignment errors can result in pn junctions 567, $867_1$-$867_n$ at the interfaces between the source/drain regions and immediately adjacent portions of the adjacent probe pad region 580, $880_1$-$880_n$ being offset from the junction between the main portion 551, 851 of the gate structure and the corresponding second extension portion 557, $857_1$-$857_n$. This can result in a portion of the second channel link-up region 585, $885_n$ (which has the first type conductivity) at the end of the main portion of the gate structure being positioned laterally between portions of the source/drain regions (which have the second type conductivity). Thus, biasing the second extension portions 557, $857_n$ of the gate structure 550, 850 could result in a conducting channel that blocks the link-up to the channel region and gate cut isolation regions 566, $866_n$ are required.

For purposes of this disclosure, a gate cut isolation region refers to a isolation-filled trench that completely traverses the gate structure at a given location and further extends vertically completely through at least the gate conductor layer in order to electrically isolate one portion of the gate structure (e.g., the main portion, which is contacted and biased during operation) from another portion (e.g., a second extension portion), which should not be biased.

Additionally, in each of the embodiments of the test structure 400, 500, 600, 700, 800 and 900, the body contact region 490, 590, 690, 790, 890, 990, the first channel link-up region 495, 595, 695, 795, 895, 995, the probe pad region(s) 480, 580, 680, $780_1$-$780_n$, $880_1$-$880_n$, $980_1$-$980_n$, and the corresponding second channel link-up region(s) 485, 585, 685, $785_1$-$785_n$, $885_1$-$885_n$, $985_1$-$985_n$, will each be electrically isolated from the source/drain regions 411*a-b*, 511*a-b*, 611*a-b*, 711*a-b*, 811*a-b*, 911*a-b*. Techniques for electrically isolating the body contact region, first channel link-up region, the probe pad region(s) and the second channel link-up regions from the source/drain regions are discussed in greater detail below with regard to some of the specific embodiments and include, but are not limited to: (1) using isolating P-N junctions (e.g., at the interfaces of the source/drain regions with the second type conductivity with any immediately adjacent channel link-up, body contact or probe pad regions with the first type conductivity) and blocking surface silicide formation across these P-N junctions to prevent shorting (e.g., with gate extensions and/or silicide blocking masks employed during manufacture); and/or (2) using STI regions.

Figure 10A:
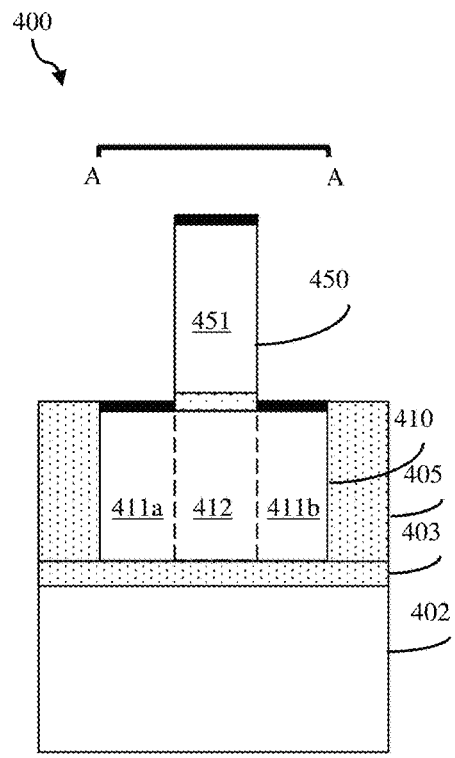
FIGS. 10A-10C are cross-section diagrams illustrating in greater detail the single-pad test structure shown in FIG. 4
Figure 10B:
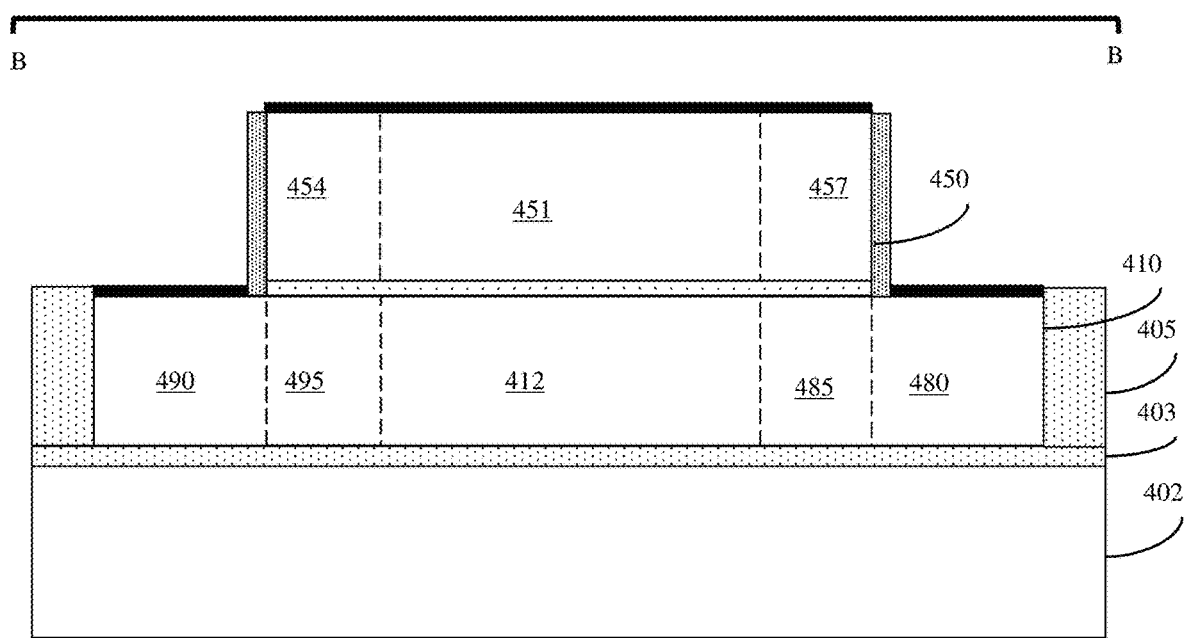
Figure 10C:
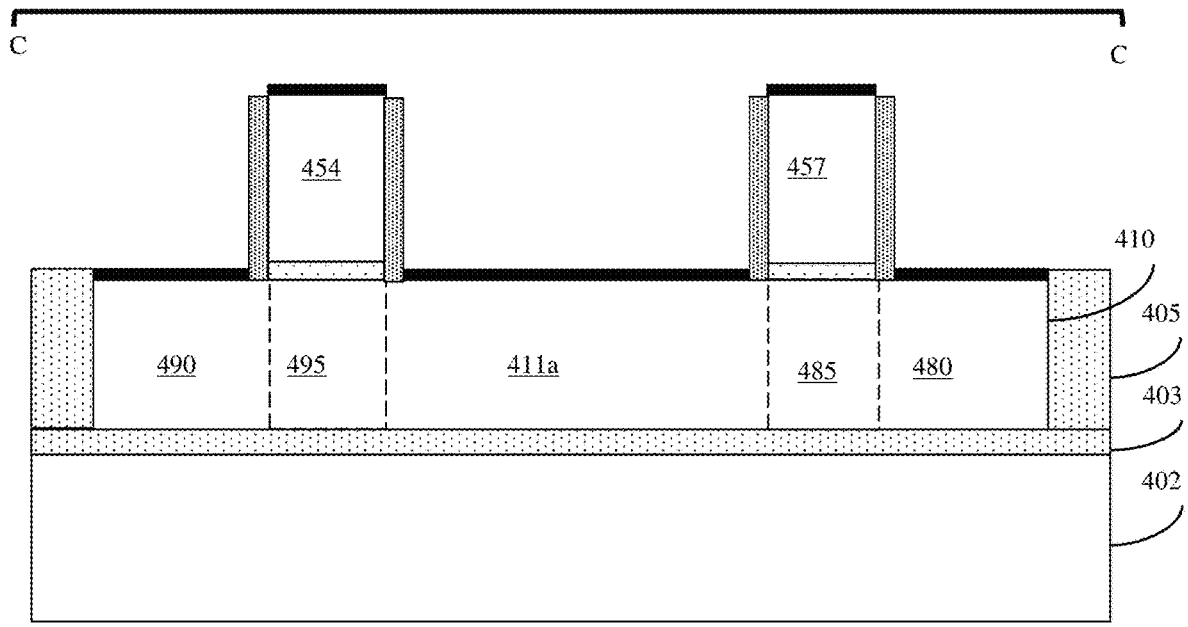

Specifically, FIGS. 10A-10C are cross-section diagrams illustrating in greater detail the exemplary single-pad test structure 400 shown in FIG. 4 and described above. This single-pad test structure 400 is an SOI structure that includes a substrate 402 (e.g., a silicon substrate or some other suitable substrate), an insulator layer 403 (e.g., a silicon dioxide layer or some other suitable insulator layer) on the substrate 402, and a BCFET 401 on the insulator layer 403. As discussed above, the BCFET 401 includes a semiconductor body 410 having: a channel region 412 with first and second sides and first and second ends; source/drain regions 411*a*-411*b* adjacent to the first and second sides, respectively, of the channel region 412; a body contact region 490 connected by a first channel link-up region 495 to a first connection point 471 of the channel region 412 at the first end; and a probe pad region 480 connected by a second channel link-up region 485 to a second connection point 472 of the channel region 412 at the second end.

Figure 10D:
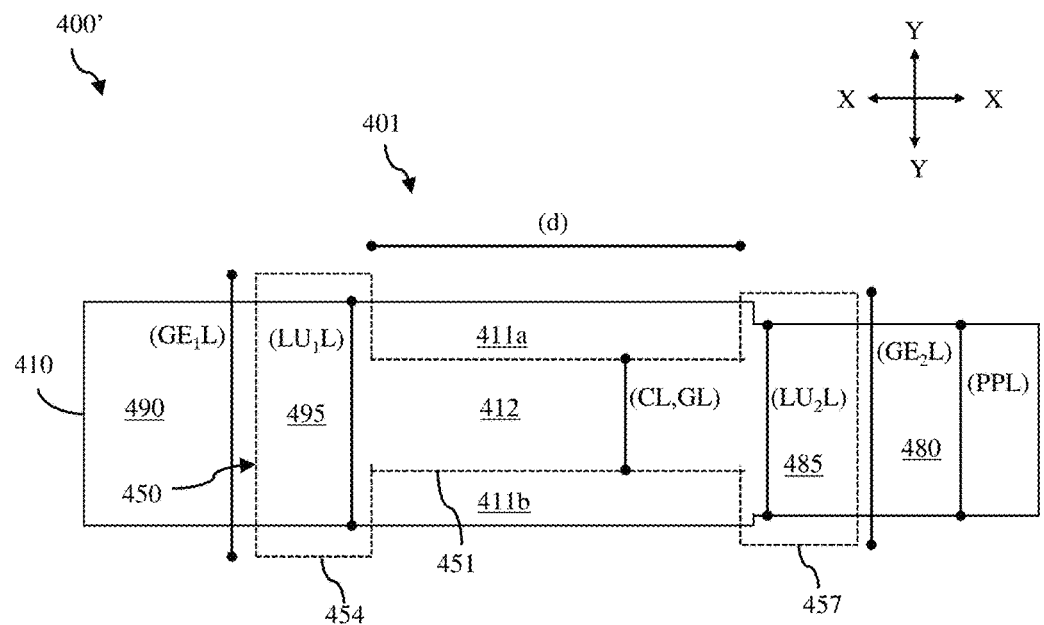
FIG. 10D is a diagram illustrating an alternative configuration for this test structure.

The BCFET 401 further includes a gate structure 450. The gate structure 450 can have a main portion 451 on the channel region 412. The channel width (CW) is measured in a first direction (referred to as the X direction) between the first end and the second end of the channel region 412. The channel length (CL) (and, thus, the corresponding gate length (GL) or length of the main portion 451 of the gate structure 450) is measured in a second direction (referred to as the Y direction) between the first side and the second side and perpendicular to the first direction. The gate structure 450 can further have: a first extension portion 454 on the first channel link-up region 495 between the body contact region 490 and the channel region 412; and a second extension portion 457 on the second channel link-up region 485 between the probe pad region 480 and the channel region 412. The first and second extension portions 454 and 457 are longer than the main portion 451 (i.e., $GE_1L>GL$ and $GE_2L>GL$, as measured in the Y direction) and further completely traverse the semiconductor body 410 such that ends of the extension portions extend onto the adjacent STI regions 405. The lengths of these extensions portions 454 and 457 of the gate structure 450 could, however, be the same or different. For example, as illustrated in FIGS. 4 and 10D, $GE_2L>GE_1L>GL$. However, it should be understood that FIG. 4 is not intended to be limiting and that, alternatively, $GE_2L=GE_1L>GL$ or $GE_1L>GE_2L>GL$.

In any case, during a masked dopant implantation process to form the body contact and probe pad regions, the first and second extension portions 454 and 457 block doping of the region of the semiconductor body below and, thereby ensure that the channel link-up regions 495 and 485 aligned below the center sections of the extension portions 454 and 457 of the gate structure 450, respectively, retain the initial first type conductivity at the relatively low conductivity level. The resulting first and second channel link-up regions 495 and 485 extend from one side of the semiconductor body to the other. The lengths of the first and second channel link-up regions 495 and 485 are less than the lengths of the corresponding extension portions that extend on the STI regions (i.e., $LU_1L<GE_1L$ and $LU_2L<GE_2L$), but greater than the length of the channel region (i.e., $LU_1L>CL$ and $LU_2L>CL$). Thus, the first and second channel link-up regions 495 and 485 are immediately adjacent to, not only the channel region 412, but also the source/drain regions 411a-411b.

In this single-pad test structure 400, electrical isolation between the source/drain regions 411a-411b and the first and second channel link-up regions 495 and 485 is achieved by a combination of: (1) isolating P-N junctions, which are formed at the interfaces between the source/drain regions 411a-411b and the areas of the first and second channel link-up regions 495 and 485 that are immediately adjacent to the source/drain regions 411a-411b; and (2) first and second extension portions 454 and 457 of the gate structure, which completely traverse the semiconductor body 410 at the channel link-up regions and blocks surface silicide formation across the isolating P-N junctions during silicidation processing, thereby preventing silicide-induced shorts between the source/drain regions 411a-411b and the adjacent first and second channel link-up regions 495 and 485.

For illustration purposes, the semiconductor body 410 of the BCFET 401 is shown in FIG. 4 as being essentially rectangular in shape. However, it should be understood that FIG. 4 is not intended to be limiting. Alternatively, the semiconductor body 410 could have some different shape (i.e., the sizes of the different regions can vary). For example, as illustrated in FIG. 10D, in one alternative configuration 400' second channel link-up region 485 and the probe pad region 480 can both be longer (as measured in the Y direction) than the channel region 412, but shorter than the first channel link-up region 495 and body contact region 490. That is, $LU_1L>LU_2L>CL$.

It should be noted that the technique employed to achieve electrical isolation from the source/drain regions 411a-411b in the single-pad test structure 400 can also be employed to achieve electrical isolation from the source/drain regions in a multi-pad test structure (e.g., see the source/drain regions 711a-711b, which are electrically isolated from the first channel link-up region 795, the body contact region 790, the second channel link-up regions $785_1$-$785_n$ and the probe pad regions $780_1$-$780_n$ in the multi-pad test structure 700 of FIG. 7).

Figure 11A:
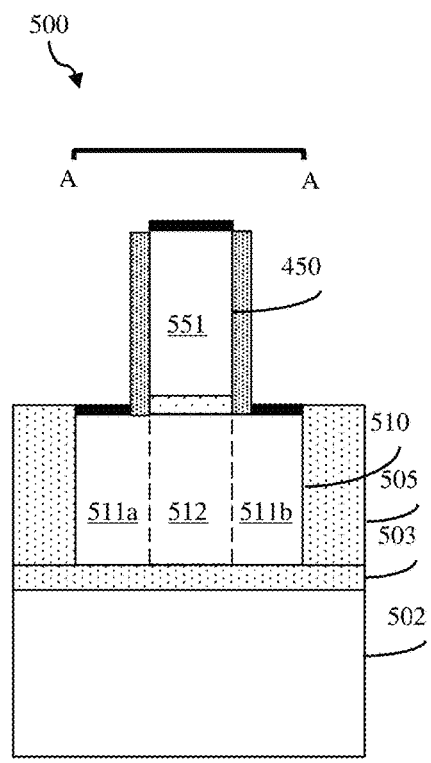
FIGS. 11A-11C are cross-section diagrams illustrating in greater detail the single-pad test structure shown in FIG. 5
Figure 11B:
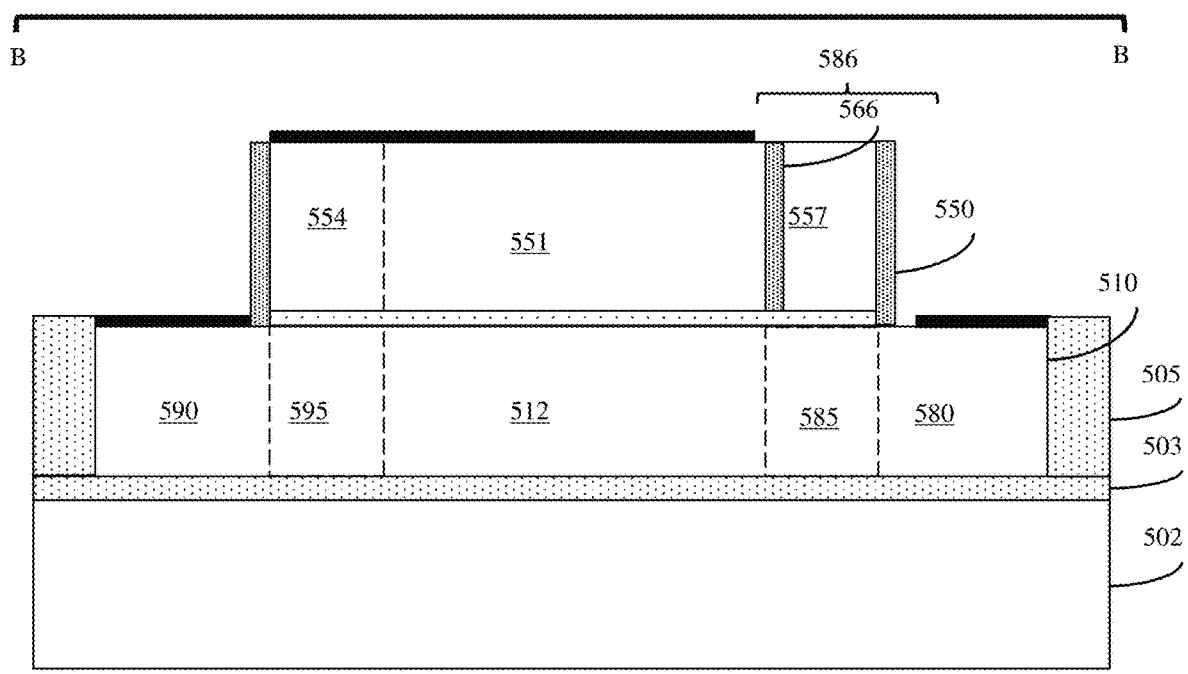
Figure 11C:
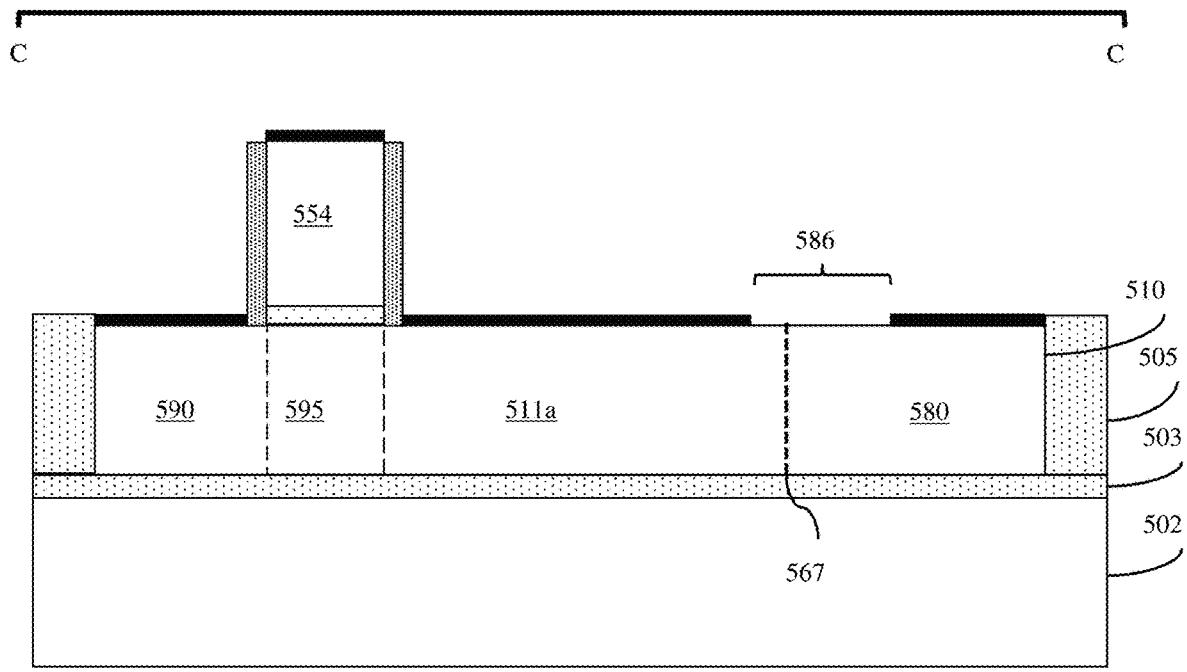

FIGS. 11A-11C are cross-section diagrams illustrating in greater detail the exemplary single-pad test structure 500 shown in FIG. 5 and described above. This single-pad test structure 500 is an SOI structure that includes a substrate 502 (e.g., a silicon substrate or some other suitable substrate), an insulator layer 503 (e.g., a silicon dioxide layer or some other suitable insulator layer) on the substrate 502, and a BCFET 501 on the insulator layer 503. As discussed above, the BCFET 501 includes a semiconductor body 510 having: a channel region 512 with first and second sides and first and second ends; source/drain regions 511a-511b adjacent to the first and second sides, respectively, of the channel region 512; a body contact region 590 connected by a first channel link-up region 595 to a first connection point 571 of the channel region 512 at the first end; and a probe pad region 580 connected by a second channel link-up region 585 to a second connection point 572 of the channel region 512 at the second end.

The BCFET 501 further includes a gate structure 550. The gate structure 550 can have a main portion 551 on the channel region 512. The channel width (CW) is measured in a first direction (referred to as the X direction) between the first end and the second end of the channel region 512. The channel length (CL) (and, thus, the corresponding gate length (GL) or length of the main portion 551 of the gate structure 550) is measured in a second direction (referred to as the Y direction) between the first side and the second side and perpendicular to the first direction.

The gate structure 550 can further have: a first extension portion 554 on the first channel link-up region 595 between the body contact region 590 and the channel region 512; and a second extension portion 557 on the second channel link-up region 585 between the probe pad region 580 and the channel region 512. The first extension portion 554 can be longer than the main portion 551 (i.e., $GE_1L>GL$), can completely traverse the semiconductor body 510, and can extend onto the adjacent STI regions 505 in the same manner as described in detail above with regard to the first extension portion 454 of the gate structure 450 of the single-pad test structure 400. The second extension portion 557 can have the same length as the main portion 551 or a shorter length, as measured in the Y direction (i.e., $GE_2L \le GL$) and can further have a shorter length than the semiconductor body 510 in this region such that it does not completely traverse the semiconductor body 510. Thus, areas of the semiconductor body 510 extend beyond, not only the end of the second extension portion 557 of the gate structure 550, but also on opposing sides of the second extension portion 557. During a masked dopant implantation process to form the body contact and probe pad regions, the second extension portion 557 blocks doping of the region of the semiconductor body below and, thereby ensures that the second channel link-up regions 585 retains the initial first type conductivity at the relatively low conductivity level. Additionally, since the second extension portion 557 does not completely traverse the semiconductor body 510, the resulting probe pad region 580 with the first type conductivity at the relatively high conductivity level will laterally surround three sides of the second channel link-up region 585 (i.e., will include the areas of the semiconductor body that extend beyond the end and the opposing sides of the second extension portion 557 of the gate structure 550). As a result, the length of the probe pad region 580 (as measured in the Y direction) is greater than the length of the second extension portion 557 and second channel link-up region 585 (i.e., PPL>$GE_2$L and $LU_2$L). As discussed above, the second extension portion 557 can be electrically isolated from the main portion 551 by a gate cut isolation region 566.

In this single-pad test structure 500, areas of the probe pad region 580 on either side of the second channel link-up region 585 are immediately adjacent to the source/drain regions 511*a*-511*b*. Electrical isolation between the source/drain regions 511*a*-511*b* and the first channel link-up region 595 is achieved in the same manner as described above with respect to the source/drain regions 411*a*-411*b* and the first channel link-up region 495 of the test structure 400. Electrical isolation between the source/drain regions 511*a*-511*b* and the immediately adjacent areas of the probe pad region 580 is achieved by a combination of: (1) isolating P-N junctions, which are formed at the interfaces between the source/drain regions 511*a*-511*b* and the areas the probe pad region 580 that are immediately adjacent to the source/drain regions 511*a*-511*b*; and (2) the use of a silicide blocking mask over the second extension portion 557 of the gate and the areas of the semiconductor body between each side of the semiconductor body and the adjacent STI region 505 during silicidation processing to prevent surface silicide formation across the isolating P-N junctions. Specifically, the single-pad test structure 500 includes silicide-free areas 586 on the top surface of the semiconductor body (i.e., areas that are devoid of silicide material) directly above the interfaces between the source/drain regions 511*a*-511*b* and the immediately adjacent areas of the probe pad region 580 and these silicide-free areas 586 prevent silicide-induced shorts between the source/drain regions 511*a*-511*b* and the probe pad region 580.

Figure 11D:
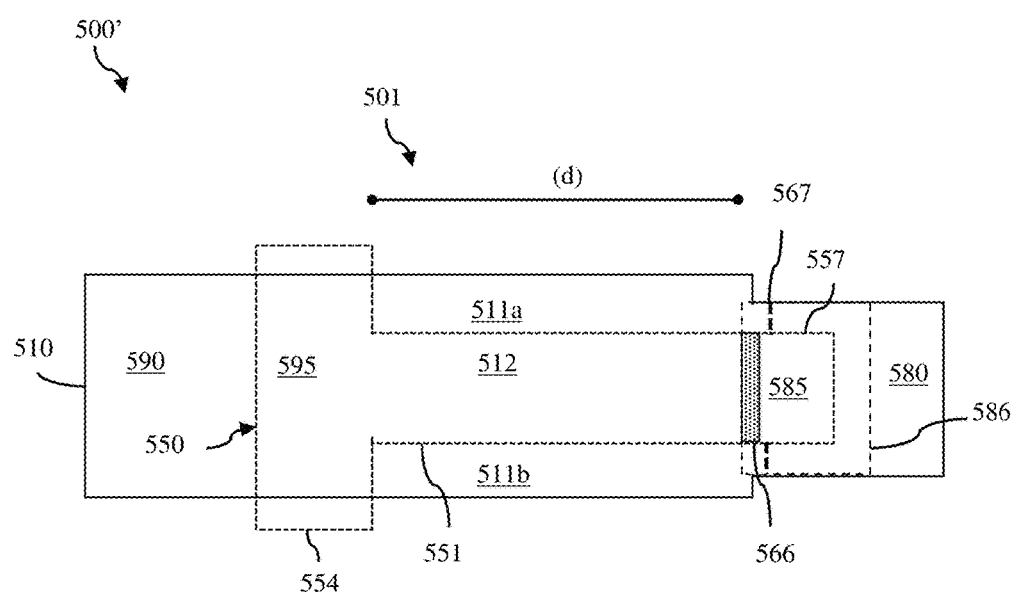
FIG. 11D is a diagram illustrating an alternative configuration for this test structure.

For illustration purposes, the semiconductor body 510 of the BCFET 501 is shown in FIG. 5 as being essentially rectangular in shape. However, it should be understood that FIG. 5 is not intended to be limiting. Alternatively, the semiconductor body 510 could have some different shape (i.e., the sizes of the different regions can vary). For example, as illustrated in FIG. 11D, in one alternative configuration 500', the probe pad region 580 can be longer (as measured in the Y direction) than the channel region 512, but shorter than the body contact region 590.

It should be noted that the technique employed to achieve electrical isolation from the source/drain regions 511*a*-511*b* in the single-pad test structure 500 can also be employed to achieve electrical isolation from the source/drain regions in a multi-pad test structure (e.g., see the source/drain regions 811*a*-811*b*, which are electrically isolated from the first channel link-up region 895, the body contact region 890, the second channel link-up regions 885$_1$-885$_n$, and the probe pad regions 880$_1$-880$_n$ in the multi-pad test structure 800 of FIG. 8). Specifically, the multi-pad test structure 800 includes silicide-free areas 886$_1$-886$_n$ on the top surface of the semiconductor body (i.e., areas that are devoid of silicide material) directly above the interfaces between the source/drain regions 811*a*-811*b* and the immediately adjacent areas of the probe pad regions 880$_1$-880$_n$ and these silicide-free areas 886$_1$-886$_n$ prevent silicide-induced shorts between the source/drain regions 811*a*-811*b* and the probe pad regions 880$_1$-880$_n$.

Figure 12A:
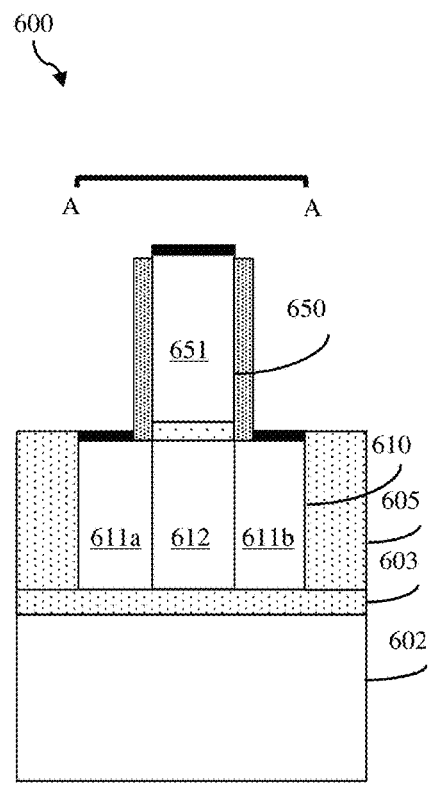
FIGS. 12A-12C are cross-section diagrams illustrating in greater detail the single-pad test structure shown in FIG. 6
Figure 12B:
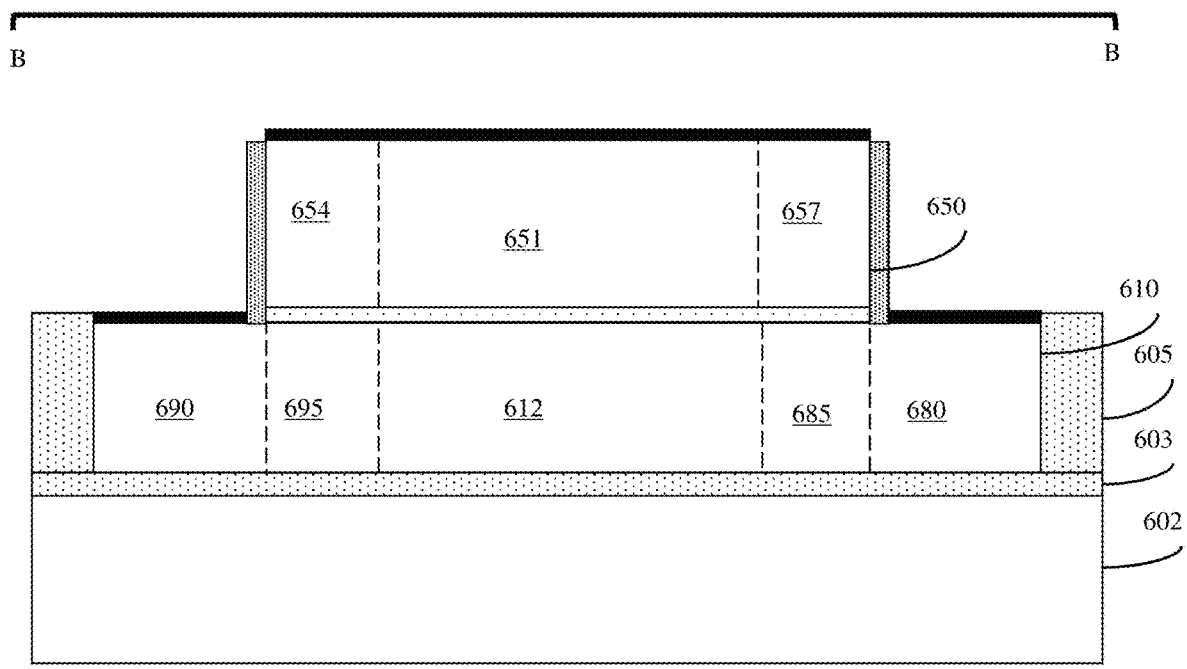
Figure 12C:
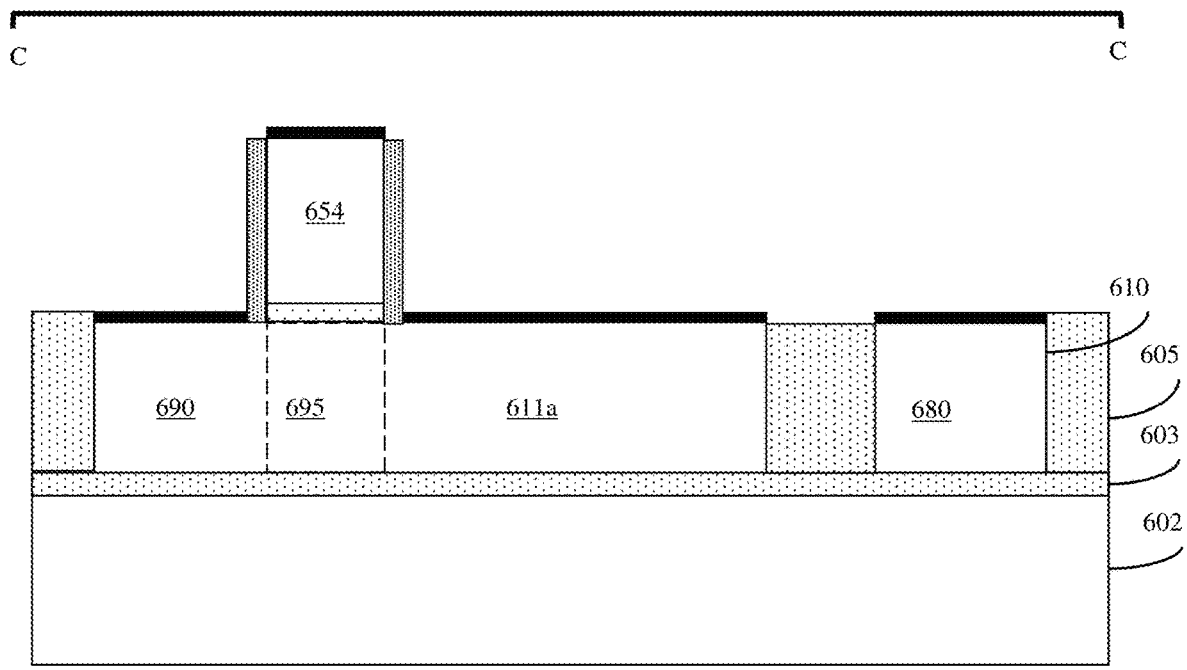

FIGS. 12A-12C are cross-section diagrams illustrating in greater detail the exemplary single-pad test structure 600 shown in FIG. 6 and described above. This single-pad test structure 600 is an SOI structure that includes a substrate 602 (e.g., a silicon substrate or some other suitable substrate), an insulator layer 603 (e.g., a silicon dioxide layer or some other suitable insulator layer) on the substrate 602, and a BCFET 601 on the insulator layer 603. As discussed above, the BCFET 601 includes a semiconductor body 610 having: a channel region 612 with first and second sides and first and second ends; source/drain regions 611*a*-611*b* adjacent to the first and second sides, respectively, of the channel region 612; a body contact region 690 connected by a first channel link-up region 695 to a first connection point 671 of the channel region 612 at the first end; and a probe pad region 680 connected by a second channel link-up region 685 to a second connection point 672 of the channel region 612 at the second end.

It should be noted that in this single-pad test structure 600, the semiconductor body 610 is not rectangular in shape and instead, during processing, the semiconductor body 610 is patterned so as to have a relatively narrow section where the second channel link-up region 685 is to be formed between a channel region 612 and a probe pad region 680. The length of this narrow section (as measured in the Y direction) can be less than the length of the channel region (CL).

The BCFET 601 further includes a gate structure 650. The gate structure 650 can have a main portion 651 on the channel region 612. The channel width (CW) is measured in a first direction (referred to as the X direction) between the first end and the second end of the channel region 612. The channel length (CL) (and, thus, the corresponding gate length (GL) or length of the main portion 651 of the gate structure 650) is measured in a second direction (referred to as the Y direction) between the first side and the second side and perpendicular to the first direction. The gate structure 650 can further have: a first extension portion 654 on the first channel link-up region 695 between the body contact region 690 and the channel region 612; and a second extension portion 657 on the second channel link-up region 685 between the probe pad region 680 and the channel region 612. The first extension portion 654 can be longer than the main portion 651 (i.e., $GE_1$L>GL), can completely traverse the semiconductor body 610, and can extend onto the adjacent STI regions 605 in the same manner as described in detail above with regard to the first extension portion 454 of the gate structure 450 of the single-pad test structure 400. The second extension portion 657 can have the same length as the main portion 651 or a shorter length, as measured in the Y direction (i.e., $GE_2$L≤GL), but can be longer than the semiconductor body 610 in the narrow section below. Thus, the second extension portion 657 can completely traverse the semiconductor body 610 at the narrow section such that ends of the second extension portion 657 extend onto the STI regions 605 and further such that STI regions 605 are positioned laterally between the source/drain regions 611*a*-611*b* and the probe pad region 680. As a result, the length of the second channel link-up region 685 is less than the length of the second extension portion 657 of the gate structure 650 (i.e., $LU_2$L<$GE_2$L) and also less the length of the main portion 651 (i.e., $LU_2$L<GL).

In this single-pad test structure 600, electrical isolation between the source/drain regions 611*a*-611*b* and the first channel link-up region 695 is achieved in the same manner as described above with respect to the source/drain regions 411*a*-411*b* and the first channel link-up region 495 of the test structure 400. Electrical isolation between the source/drain regions 611*a*-611*b* and the probe pad and the second channel link-up regions 680, 685 is provided by the STI regions 605.

Figure 12D:
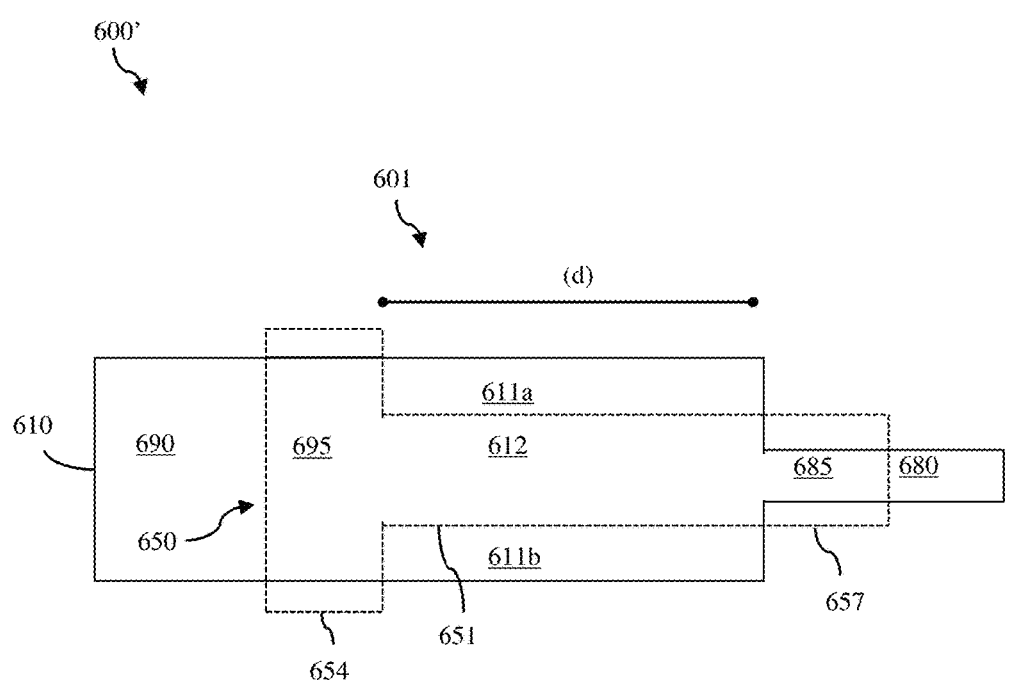
FIG. 12D is a diagram illustrating an alternative configuration for this test structure.

It should be understood that the shape of the semiconductor body 610 shown in FIG. 6 is not intended to be limiting. Alternatively, the semiconductor body 610 could have some different shape (i.e., the sizes of the different regions can vary). For example, as illustrated in FIG. 12D, in one alternative configuration 600', the length of the probe pad region 680 can also be shorter than the length of the channel region 612.

It should be noted that the technique employed to achieve electrical isolation from the source/drain regions 611a-611b in the single-pad test structure 600 can also be employed to achieve electrical isolation from the source/drain regions in a multi-pad test structure (e.g., see the source/drain regions 911a-911b, which are electrically isolated from the first channel link-up region 895, the body contact region 990, the second channel link-up regions $985_1$-$985_n$ and the probe pad regions $980_1$-$980_n$ in the multi-pad test structure 900 of FIG. 9).

With test structures 400, 500, 600, 700, 800, 900, as described above, measurements of the internal body potential (Vbi) of the channel region 412, 512, 612, 712, 812, 912 at the second connection point(s) 472, 572, 672, $772_1$-$772_n$, $872_1$-$872_n$, $972_1$-$972_n$ in response to a given set of bias conditions on the BCFET nodes can be acquired by connecting the probe pad region(s) 480, 580, 680, $780_1$-$780_n$, $880_1$-$880_n$, $980_1$-$980_n$ to voltmeter(s) (as discussed in greater detail below with regard to the method embodiments).

Figure 13:
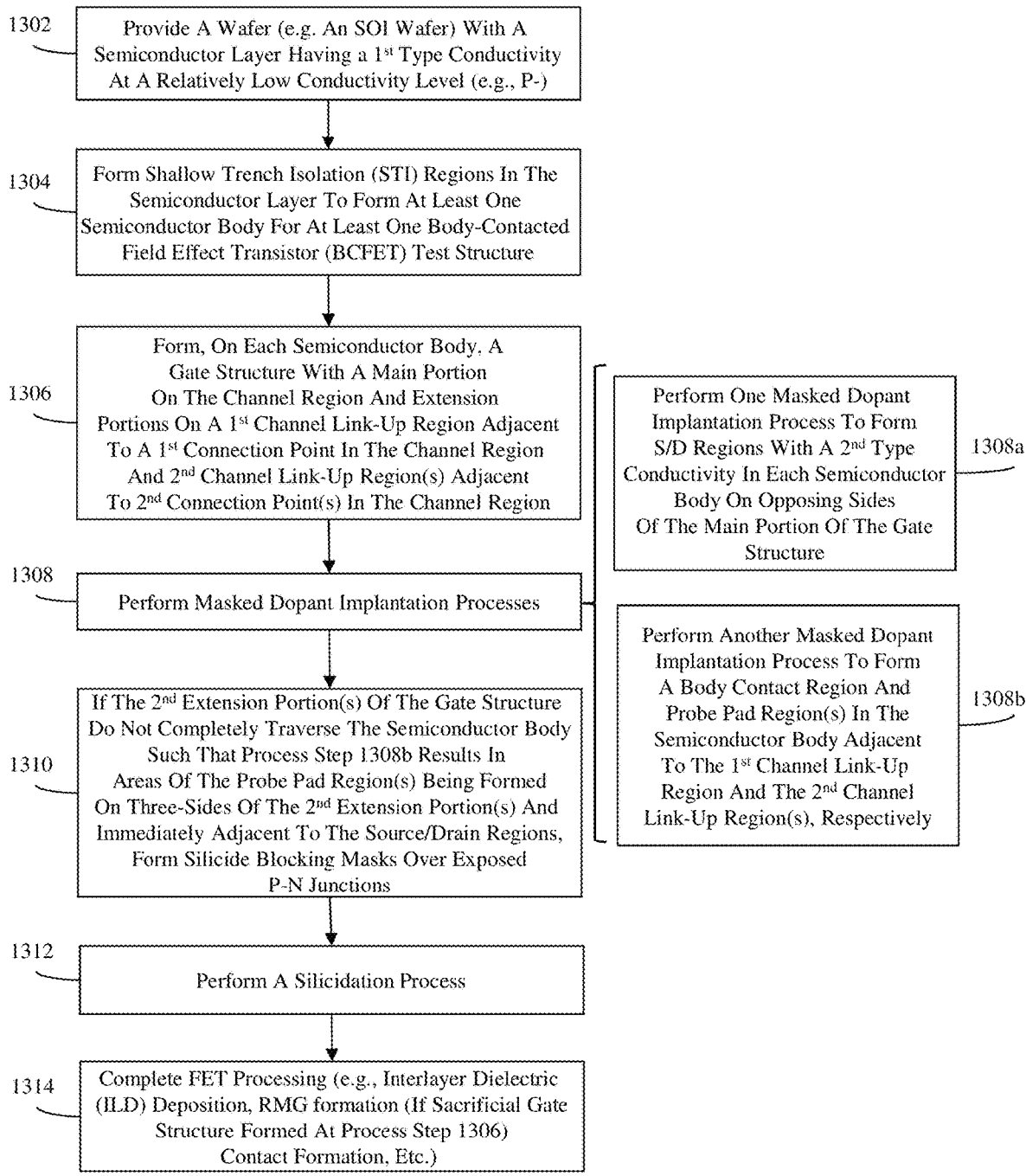
FIG. 13 is a flow diagram illustrating a process flow for forming one or more test structures for a BCFET.

FIG. 13 is a flow diagram illustrating a process flow for forming one or more of the above-described test structures for a body-contacted field effect transistor (BCFET). The method can begin with a semiconductor layer (see process step 1302). The semiconductor layer can be a semiconductor layer of a semiconductor-on-insulator wafer (e.g., a silicon layer of a silicon-on-insulator (SOI) wafer). Alternatively, the semiconductor layer could be a bulk semiconductor wafer (e.g., a bulk silicon wafer). In any case, this semiconductor layer can be doped with a first conductivity type dopant so as to have a first type conductivity at a relatively low conductivity level. For N-type BCFET formation, the semiconductor layer can be doped so as to have P− conductivity; whereas, in the case of P-type BCFET formation, the semiconductor layer can be doped so as to have N− conductivity.

Shallow trench isolation (STI) regions can be formed in the semiconductor layer so as to define the shape of at least one semiconductor body for at least one BCFET test structure (see process step 1304). Each semiconductor body can be defined so that in the resulting structure the semiconductor body can include: source/drain regions, a channel region positioned laterally between the source/drain regions and having a given channel width and length; a body contact region; a first channel link-up region for electrically connecting the body contact region to a first connection point in the channel region; probe pad region(s); and second channel link-up region(s) for electrically connecting the probe pad region(s) to second connection point(s) in the channel region.

It should be noted that the shape of each semiconductor body that is patterned into the semiconductor layer will vary depending upon the embodiment of the single-pad or multi-pad test structure being formed and will be more complex for multi-pad test structures. For example, for a single-pad test structure, the patterning process can be performed such that the semiconductor body has an essentially rectangular shape (e.g., see the semiconductor body 410 of the single-pad test structure 400 of FIG. 4 and the semiconductor body 510 of the single-pad test structure 500 of FIG. 5) or such that the semiconductor body has some areas (e.g., areas designated for the second channel link-up region and/or probe pad region) that are relatively narrow as compared to the rest of the semiconductor body (e.g., see the semiconductor body 410 of the alternative single pad test structure 400' of FIG. 10D and the semiconductor body 510 of the alternative single-pad test structure 500' of FIG. 11D, see also the semiconductor body 610 of the single-pad test structure 600 of FIG. 6 or the alternative single-pad test structure 600' of FIG. 13D). For a multi-pad test structure, the patterning process can be performed such that the semiconductor body has a main area as well as additional areas (e.g., areas designated for each second channel link-up and probe pad region) which extend from the main area (e.g., see the semiconductor body 710 of the multi-pad test structure 700 of FIG. 7, the semiconductor body 810 of the multi-pad test structure 800 of FIG. 8 and the semiconductor body 910 of the multi-pad test structure 900 of FIG. 9).

A gate structure can then be formed on the semiconductor body (see process step 1306). As illustrated, the gate structure formed at process step 1306 can be formed a conventional gate-first gate structure. For example, a relatively thin gate dielectric layer can be deposited over the partially completed structure, a gate polysilicon layer can be deposited onto the gate dielectric layer, and a hardmask layer can be formed on the gate polysilicon layer, thereby forming a gate stack. The gate stack can subsequently be lithographically patterned and etched to form a gate structure.

Alternatively, a sacrificial gate structure can be formed at process step 1306 with the intent of replacing this sacrificial gate with a replacement metal gate (RMG) during subsequent processing. For example, a think silicon dioxide layer can be formed on the semiconductor body, a sacrificial gate layer (e.g., a sacrificial polysilicon layer, a sacrificial amorphous silicon layer or other suitable sacrificial layer) can be formed on the silicon dioxide layer, and a hardmask layer can be formed on the sacrificial gate layer, thereby forming a sacrificial gate stack. The sacrificial gate stack can subsequently be lithographically patterned and etched to form a sacrificial gate structure.

In any case, the gate structure can be patterned so as to have a main portion on the channel region, a first extension portion on the first channel link-up region, and second extension portion(s) on the second channel link-up region(s). It should be noted that that the size, shape and number of the second extension portions of the gate structure will vary depending upon the embodiment of the single-pad or multi-pad test structure being formed and will be more complex for multi-pad test structures. For example, for single-pad test structures, the patterning process can be performed, for example: (A) such that the second extension portion is longer than the main portion (i.e. $GE_2L>GL$) and such that the second extension portion completely traverses the semiconductor body at the second channel link-up region (e.g., see the second extension portion 457 of the gate structure 450 of the single-pad test structure 400 of FIG. 4); (B) such that second extension portion is the same length or shorter than the main portion (i.e., $GE_2L \leq GL$) and such that the second extension portion does not completely traverse the semiconductor body (e.g., see the second extension portion 557 of the gate structure 550 of the single-pad test structure 500 of FIG. 5), or (C) such that the second extension portion is the same length or shorter than the main portion (i.e., $GE_2L<GL$) and such that the second extension portion also completely traverses a narrow section of the semiconductor body (e.g., see the second extension portion 657 of the gate structure 650 of the single-pad test structure 600 of FIG. 6). For a multi-pad test structure, similar patterning processes can be performed can be performed such that, for each second extension portion, each second extension portion either does or doesn't completely traverse a section of the semiconductor body. As discussed in detail below, for embodiments that do not pattern the second extension portion(s) of the gate structure to completely traverse a section of the semiconductor body, additional processing will be required at process step 1310 with respect to the exposed areas of the semiconductor body that extend beyond the opposing sides of the second extension portion in order to block silicide formation thereon.

Following gate structure formation, sidewall spacers can be formed on the sidewall of the gate structure (e.g., using conventional gate sidewall spacer formation techniques).

Next, multiple masked dopant implantation processes can be performed in order to form, within designated regions of the semiconductor body, the source/drain regions, the body contact region and the probe pad region(s) (see process step 1308). It should be noted that for a gate-first gate structure that includes a gate poly silicon layer, these masked dopant implantation processes can also be used to dope the main portion and extension portions of the gate polysilicon layer, as discussed below.

For example, in one masked dopant implantation process, a first mask layer can be formed over the partially completed structure and an opening can be formed (e.g., lithographically patterned and etched) into this first mask layer to expose the main portion of the gate structure and also the regions of the semiconductor body that extend laterally beyond the opposing sides of the main portion. Then, a second type conductivity dopant can be implanted into the exposed regions of the semiconductor body to form source/drain regions having a second type conductivity at a relatively high conductivity level. During this process, the second type conductivity dopant is also implanted into the gate polysilicon layer of the main portion of the gate structure. Thus, the channel region will retain the first type conductivity at the relatively low conductivity. For N-type BCFET formation, this dopant implantation process can be performed so that the source/drain regions have N+ conductivity; whereas, for P-type BCFET formation, this dopant implantation process can be performed so that the source/drain regions have P+ conductivity. Following source/drain region formation, the first mask layer can be selectively removed.

In another masked dopant implantation process, a second mask layer can be formed over the partially completed structure. Then, openings can be formed (e.g., lithographically patterned and etched) into this second mask layer in order to expose areas of the semiconductor body designated for body contact and probe pad region formation and also at least sections of the extension portions of the gate structure immediately adjacent to those regions. Then, a first type conductivity dopant can be implanted in order to form the body contact and probe pad regions having the first type conductivity at the relatively high conductivity level. During this process, the first type conductivity dopant is also implanted into the gate polysilicon layer of the extension portions of the gate structure. For N-type BCFET formation, this dopant implantation process can be performed so that the body contact and probe pad regions have P+ conductivity; whereas, for P-type BCFET formation, this dopant implantation process can be performed so that the body contact and probe pad regions have N+ conductivity. It should be understood that any gate polysilicon exposed during this dopant implantation process will similarly achieve $1^{st}$ type conductivity at the relatively high conductivity level.

It should be noted that, if the second gate extension(s) do not completely traverse the semiconductor body (e.g., as when forming the single-pad test structure 500 of FIG. 5 or the multi-pad test structure 800 of FIG. 8), then resulting probe pad region(s) will laterally surround three sides of the second channel link-up region(s) and will include areas on opposing sides of the second extensions portion(s) that are also positioned laterally immediately adjacent to the source/drain regions.

It should also be noted that, due to mask alignment issues during these dopant implantation processes, the gate polysilicon layer of the first extension portion 454, 554, 654, 754, 854, 954 and/or the second extension portion(s) 457, 557, 657, $757_1$-$757_n$, $854_1$-$857_n$, $957_1$-$957_n$ may have a proximal section (closest to the channel region) with the second type conductivity at a relatively high conductivity level and a distal section (farthest from the channel region, closest to the body contact/probe pad) with the first type conductivity at a relatively high conductivity level.

Following the above-mentioned masked dopant implantation processes, a conventional silicidation process can be performed in order to form silicide layers on exposed surfaces of the semiconductor body and gate polysilicon (see process step 1312). However, in embodiments where the second gate extension portion of the gate structure does not completely traverse the semiconductor, a silicide blocking mask must first be formed in order to prevent silicide formation on exposed P-N junctions between the source/drain regions and the probe pad region (e.g., as when forming the single-pad test structure 500 of FIG. 5 or the multi-pad test structure 800 of FIG. 8) (see process step 1310). More specifically, in test structures formed according the disclosed method, the body contact region, first channel link-up region, the probe pad region(s) and the second channel link-up regions need to be electrically isolated from the source/drain regions. This can be achieved with STI regions (e.g., as when forming the single-pad test structure 600 of FIG. 6 or the multi-pad test structure 900 of FIG. 9). Alternatively, this can be achieved through with isolating P-N junctions at the interfaces between the source/drain regions (which have the second type conductivity) and the adjacent regions of the semiconductor body (which have the first type conductivity). However, if the P-N junctions are exposed during silicide formation, silicide layers formed across the P-N junction will electrically connect the adjacent regions. For example, as mentioned above, if the second gate extension(s) do not completely traverse the semiconductor body (e.g., as when forming the single-pad test structure 500 of FIG. 5 or the multi-pad test structure 800 of FIG. 8), then resulting probe pad region(s) will laterally surround three sides of the second channel link-up region(s) and will include areas on opposing sides of the second extensions portion(s) that are also positioned laterally immediately adjacent to the source/drain regions. Thus, in order to avoid shorting between the source/drain regions and the immediately adjacent probe pad regions, when forming the single-pad test structure 500 of FIG. 5 or the multi-pad test structure 800 of FIG. 8, a silicide blocking mask can be formed over the second extension portion(s) and the adjacent areas of the probe pad region(s) on the opposing sides of the second extension portion(s) at process step 1310 prior to performing the silicidation process at process step 1312.

Additional processing can then be performed in order to complete the test structure(s) (see process step 1314). This additional processing can include, but is not limited to, interlayer dielectric (ILD) deposition, contact formation, etc.

It should be noted that the additional processing at process step 1314 can include replacement metal gate (RMG) processing if that gate structure previously formed at process step 1306 was a sacrificial gate. For example, following ILD deposition, a chemical mechanical polishing (CMP) process could be performed in order to expose the sacrificial gate layer and the sacrificial gate layer can subsequently be selectively removed (e.g., using a selective etch process) to form a gate opening. As mentioned above, formation of the sacrificial gate structure typically includes deposition of a thin silicon dioxide layer prior to deposition of the sacrificial gate layer. This thin silicon dioxide layer protects the semiconductor materials during removal of the sacrificial gate layer. Following removal of the sacrificial gate layer, this thin silicon dioxide layer can also be removed from the gate opening (e.g., by buffered hydrofluoric acid (BHF)). Then, a RMG can be formed in the gate opening. For example, a conformal high K gate dielectric layer can be deposited so as to line the gate opening and one or more gate metal layers (e.g., work function metal layer(s) and conductive fill metal on the work function metal layer(s)) can be deposited on the high K gate dielectric layer.

Those skilled in the art will recognize that a high-K gate dielectric layer refers to a gate dielectric layer made of a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). For an N-type BCFET, the work function metal can be an N-type work function metal, whereas, for a P-type BCFET, the work function metal can be a P-type work function metal. The optimal gate conductor work function of NFETs can be, for example, between 3.9 eV and about 4.2 eV. Exemplary N-type work function metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for PFETs can be, for example, between about 4.9 eV and about 5.2 eV. Exemplary P-type work function metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The conductive fill material layer can be a fill metal or fill metal alloy, such as tungsten, a tungsten alloy (e.g., tungsten silicide or titanium tungsten), cobalt, aluminum or any other suitable fill metal or fill metal alloy.

It should be noted that the method can further include forming one or more gate cut isolation regions when/if necessary (i.e., when, during operation, biasing the second extension portion of the gate structure would create a conducting channel that traverses the second channel link-up region below in a direction that is essentially perpendicular to the electrical connection between the channel region and the probe pad region and that, thereby blocks the electrical connection between the channel region and the probe pad region). For example, see the gate cut isolation region 566 in the gate structure 550 of FIG. 5, the gate cut isolation regions 766$_1$-766$_3$ in the gate structure 750 of FIG. 7, the gate cut isolation regions 866$_1$-866$_2$ in the gate structure 850 of FIG. 8, and the gate cut isolation regions 966$_1$-966$_3$ in the gate structure 950 of FIG. 9. Each of the above-mentioned gate cut isolation regions 566, 766$_1$-766$_3$, 866$_1$-866$_n$, 966$_1$-966$_3$ electrically isolates the main portion of the gate structure from a corresponding second extension portion of the gate structure in order to prevent biasing of that second extension portion when the main portion of the gate structure is biased.

Techniques for forming gate cut isolation regions are known in the art and, thus, have been omitted from this specification in order to allow the reader to focus on the salient aspects of the disclosed embodiments. However, it should be understood that such gate cut isolation regions can be formed before at different stages during processing depending upon whether the gate structure in the final test structure is a gate first gate structure with a polysilicon gate conductor layer or a replacement metal gate (RMG) structure. For example, after the gate stack is patterned and etched, an additional patterning and etch process can be performed in order to form gate cut trench(es) in the gate stack at the desired locations. The gate cut trench(es) can then be filled with isolation material, thereby forming the gate cut isolation region(s). Optionally, filling the gate cut trench(es) with isolation material can be achieved when depositing gate sidewall spacer material during gate sidewall spacer formation. Alternatively, if RMG structures are used, the gate cut isolation region(s) could be formed at the desired location(s) within the sacrificial gate structure or during or after formation of the RMG.

Thus, processing for the BCFET test structures disclosed herein is essentially the same as conventional BCFET process except that: (a) at process step 1304 the patterned shape of the semiconductor body can vary depending upon the particular BCFET single-pad or multi-pad test structure being formed; (b) at process step 1306 the patterned shape of the gate structure can vary depending upon the particular BCFET single-pad or multi-pad test structure being formed; (c) at process step 1308, the patterned shape of the mask openings for body contact and probe pad region doping may vary depending upon the particular BCFET single-pad or multi-pad test structure being formed; (d) at process step 1310, a silicide blocking mask may need to be formed to avoid shorting between the source/drain regions and the probe pad region(s) depending upon the particular BCFET single-pad or multi-pad test structure being formed; and (e) gate cut isolation region(s) may be required to ensure the probe pad region(s) stay electrically connected to the channel region through the channel link-up regions.

Figure 14:
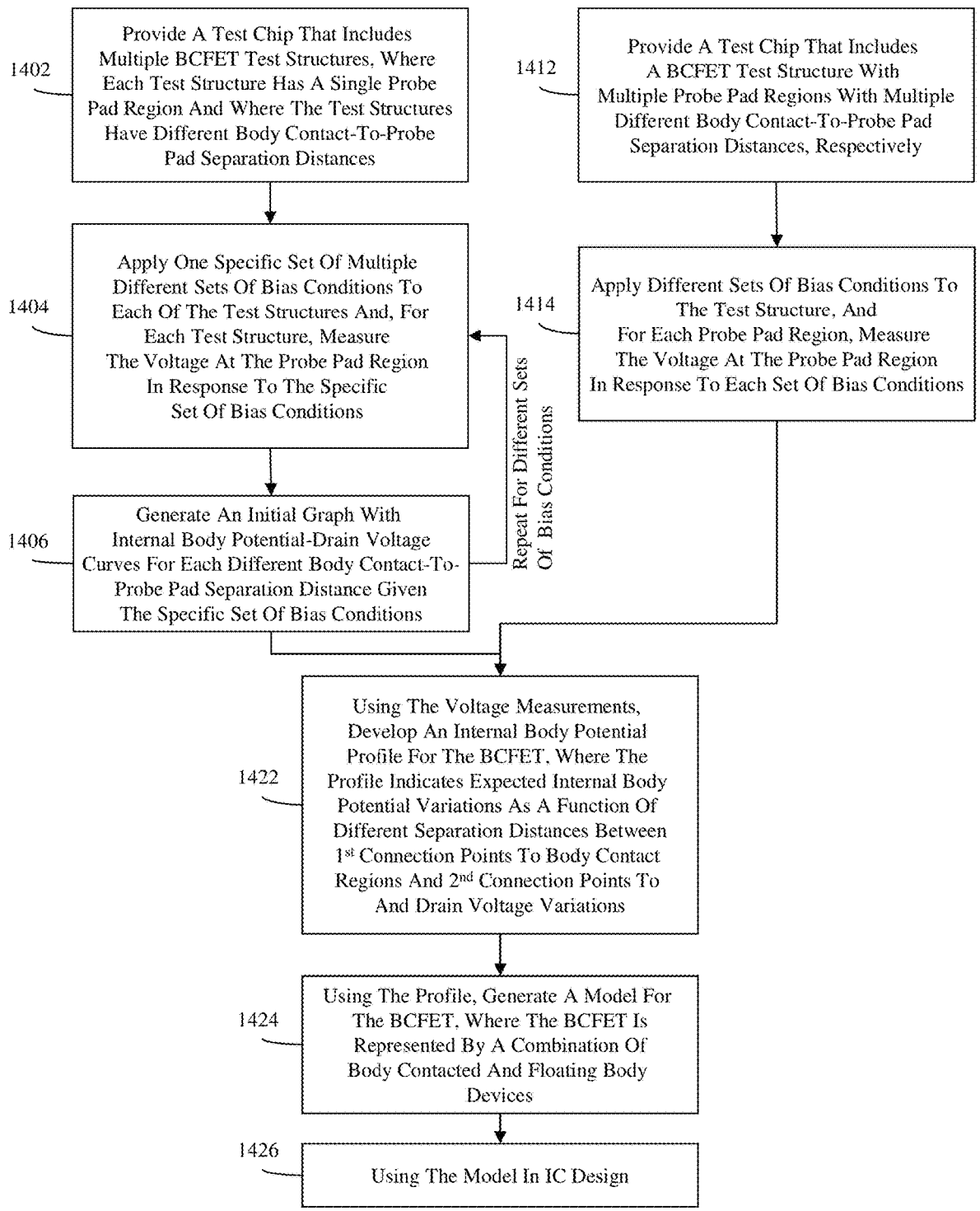
FIG. 14 is a flow diagram illustrating method embodiments that employ multiple instances of a single-pad test structure or, alternatively, a multi-pad test structure to develop an internal body potential profile for a BCFET and to generate a performance model based on the internal body potential profile.

FIG. 14 is a flow diagram illustrating method embodiments that employ multiple instances of a single-pad test structure (as described above) or, alternatively, a multi-pad test structure (as described above) to develop an internal body potential profile for a body-contacted field effect transistor (BCFET) and to generate a performance model based on the internal body potential profile.

Specifically, one method embodiment can include forming, on a test chip, multiple different instances of a single-pad test structure (e.g., the single-pad test structure 400 of FIG. 4, 500 of FIG. 5 or 600 of FIG. 6, see the detailed discussion of theses test structures above) (see process step 1402). The different instances of the single-pad test structure can be configured essentially the same except for the separation distances (d) between the first connection point 471, 571, 671 (which is connected to the body contact region 490, 590, 690 via the first channel link-up region 495, 595, 695) and the second connection point 472, 572, 672 (which is connected to the probe pad region 480, 580, 680 via the second channel link-up region 485, 585, 685). That is, within the multiple instances of the single-pad test structure that are employed in the method, the first connection point 471, 571, 671 and the second connection point 472, 572, 672 can be separated by different separation distances $d_1$, $d_2$, $d_3$, etc. For example, the different instances of the single-pad test structure can include BCFETs with different channel widths (e.g., 2.5 µm, 5 µm, 7.5 µm, 10 µm, etc.). For T-gate BCFETs (as illustrated) or L-gate BCFETs, the first connection point 471, 571, 671 can be located at a first end of the channel region 412, 512, 612 and the second connection point 472, 572, 672 can be located at a second end of the channel region opposite the first end and, thus, each separation distance will be equal to the corresponding channel width of the BCFET. Alternatively, for H-gate BCFETs, the first connection point can be located at a midline between the first end and the second end of the channel region and the second connection point can be located at one end of the channel region and, thus, each separation distance will be equal to one-half the corresponding channel width of the BCFET.

This method embodiment can further include applying different sets of bias conditions (e.g., drain voltage (Vd), gate voltage (Vg) and body contact voltage (Vext)) in some sequence to each instance of the test structure and, for each given instance of the test structure, measuring the voltage level on the probe pad region of the given instance in response to application of each specific set of bias conditions (e.g., using a voltmeter) (see process step 1404). As discussed in greater detail below, the voltage level on the probe pad region in response to a specific set of bias conditions will be indicative of the internal body potential (Vbi) of the channel region 412, 512, 612 at the second connection point 472, 572, 672 and under the specific set of bias conditions. Thus, this method embodiment can be used to acquire different internal body potentials ($Vbi_1$, $Vbi_2$, ... $Vbi_n$) at the different separation distances (e.g., $d_1$, $d_2$, ... $d_n$) associated with the different instances of the single-pad test structure and at different drain voltages ($Vd_1$, $Vd_2$, ... $Vd_x$).

Another method embodiment can include forming, on a test chip, a multi-pad test structure (e.g., the multi-pad test structure 700 of FIG. 7, 800 of FIG. 8 or 900 of FIG. 9, see the detailed discussion of these test structures above) (see process step 1412). In this multi-pad test structure, the second connection points, which are connected to the probe pad regions via the second channel link-up regions, can be spaced a different separation distance (e.g., 2.5 µm, 5 µm, 7.5 µm, 10 µm, etc.) from the first connection point, which is connected to the body contact region via the second channel link-up region. This method embodiment can further include applying different sets of bias conditions (e.g., drain voltage (Vd), gate voltage (Vg) and body contact voltage (Vext)) in some sequence to the multi-pad test structure and measuring the voltage levels on each the probe pad regions, respectively, in response to application of each specific set of bias conditions (see process step 1414). Thus, this method embodiment can be used to acquire different internal body potentials ($Vbi_1$, $Vbi_2$, ... $Vbi_n$) at the different separation distance (e.g., $d_1$, $d_2$, ... $d_n$) associated with the different probe pad regions of a multi-test structure and at different drain voltages ($Vd_1$, $Vd_2$, ... $Vd_x$).

As discussed below, the voltage levels on the probe pad regions of the multiple different instances of the single-pad test structure in response to a specific set of bias conditions or, alternatively, the voltage levels on the probe pad regions of the multi-pad structure in response to the specific set of bias conditions will be indicative of the internal body potentials of the channel region at the corresponding second connection points and, particularly, at the corresponding separation distances from the first connection point given the specific set of bias conditions.

Each of the method embodiments described above can further include, based on the results of the above-described measuring of the voltage levels on the probe pad regions of multiple different instances of single-pad test structure or a single instance of a multi-pad test structure in response to each of multiple sets of bias conditions, developing an internal body potential profile for a body-contacted field effect transistor (BCFET), which indicates the expected internal body potential variations (e.g., $Vbi_1$, $Vbi_2$, ... $Vbi_n$) in the BCFET as a function of different separation distances (e.g., $d_1$, $d_2$, ... $d_n$) between the first connection point to the body contact region (via a body-contact to channel link-up region) and the second connection points to probe pad regions (via probe pad to channel link-up regions) and different drain voltage ($Vd_1$, $Vd_2$, ... $Vd_x$) (see process step 1422).

Figure 15A:
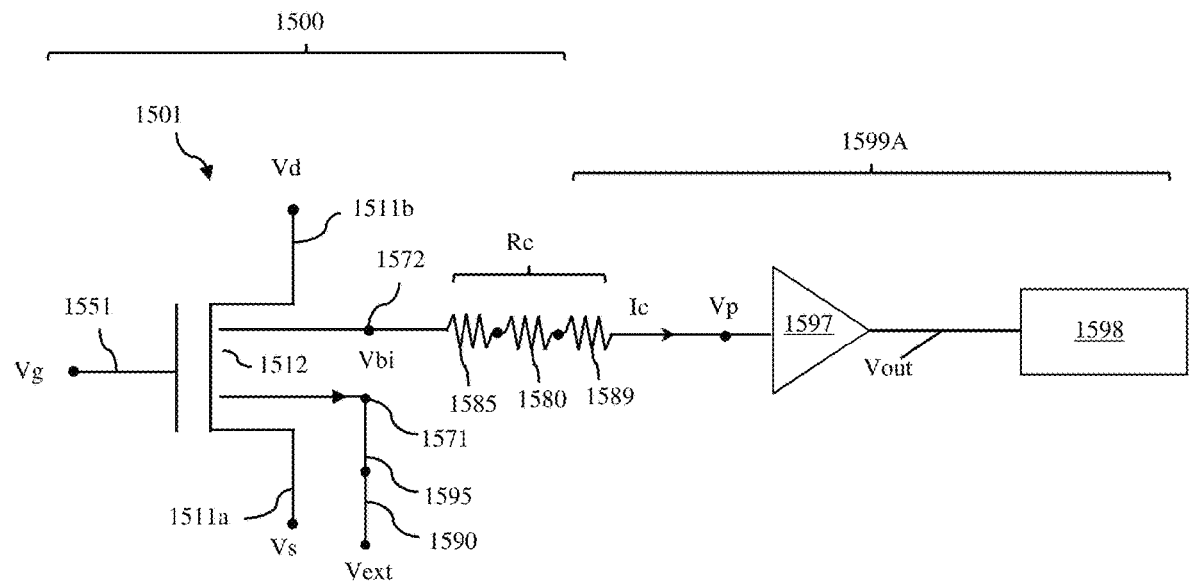
FIGS. 15A-15C are schematic diagrams illustrating exemplary measurement circuits for BCFET test structures.
Figure 15B:
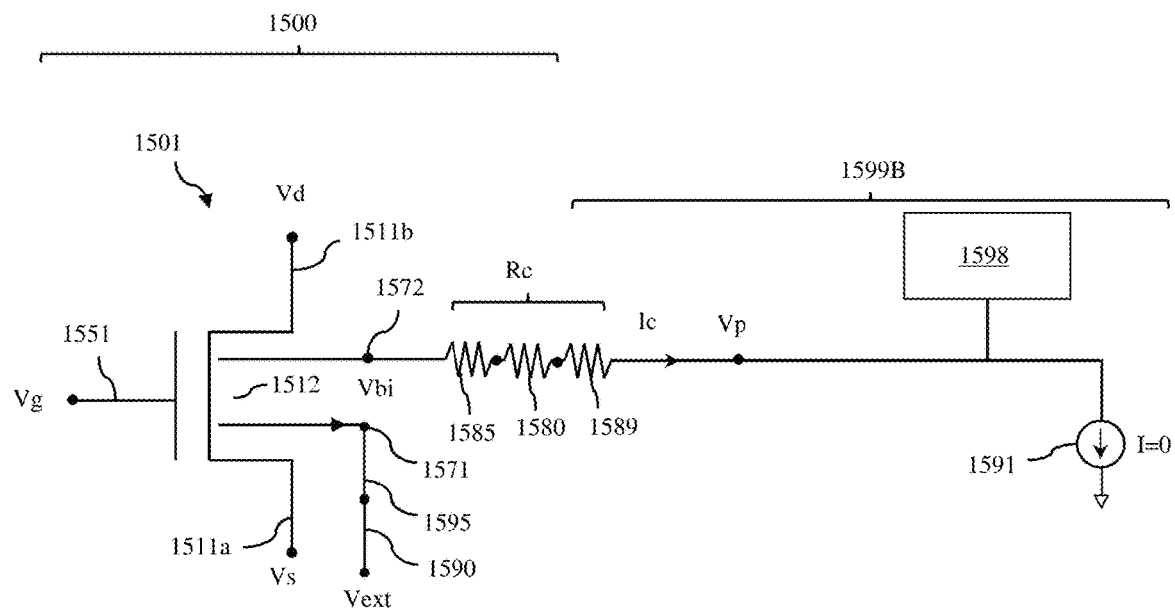

More particularly, FIGS. 15A and 15B are schematic diagrams illustrating exemplary measurement circuits 1599A or 1599B, which can be employed for use with any of the disclosed test structure embodiments (e.g., a test structure 1500 for a T-gate BCFET 1501). The test structure 1500 can be a single-pad or multi-pad test structure (which is, for example, configured in essentially the same manner as any of the test structures 400, 500, 600, 700, 800, or 900 described in detail above and illustrated in FIG. 4, 5, 6, 7, 8 or 9); however, for purposes of illustration only a single probe pad region 1580 is illustrated. As illustrated, the BCFET 1501 can include a source region 1511a, a drain region 1511b, a channel region 1512 positioned laterally between the source region and the drain region, and a main portion 1551 of a gate structure on the channel region 1512. The BCFET 1501 can also include a body contact region 1590 connected to a first connection point 1571 in the channel region 1512 by first channel link-up region 1595 and at least one probe pad region 1580 connected to a second connection point 1572 in the channel region 1512 by a second channel link-up region 1585.

These measurement circuits 1599A and 1599B each include a voltmeter 1598 and also contacts/other wiring 1589 that electrically connect the probe pad region 1580 to the voltmeter 1598. The voltmeter 1598 is used to measure an actual voltage amount (Vp), which equates to an internal body potential (Vbi) when the amount of current (Ic) through the second channel link-up region 1585, probe pad region 1580 and contact/other wiring 1589 is very small (e.g., less than 1 pA or approximately 0).

Measurement circuit 1599A can be employed at process step 1404 or 1414 if the actually measured voltage (Vp) is above or below the measurement threshold of the voltmeter 1598. Specifically, the measurement circuit 1599A can include a buffer amplifier 1597 (with voltage gain (Av)) connected to the voltmeter 1598 and also contacts/other wiring 1589 that electrically connect the probe pad region 1580 to the buffer amplifier 1597. The effective resistance (Rc) between the second connection point 1572 and the buffer amplifier 1597 will include the resistance of the second channel link-up region 1585 (which is immediately adjacent to the second connection point 1572), the resistance of the probe pad region 1580 (which is immediately adjacent to the second channel link-up region), and the contact/other wiring 1589 that connect the probe pad region 1580 and the buffer amplifier 1597 and, thereby to the voltmeter 1598. The value of this effective resistance (Rc) does not, however, influence the voltage level at the second connection point 1572 (i.e., the internal body voltage (Vbi) at this second connection point 1572) if/when the current (Ic) through the second channel link-up region 1585, probe pad region 1580 and contact/other wiring 1589 is very small (e.g., less than 1 pA or approximately 0). In this case, the internal body voltage (Vbi) will be almost equal to the voltage level (Vp) at the input to the buffer amplifier 1597 and the voltage level (Vp) at the input to the buffer amplifier 1597 will be equal to the voltage level at the output of the buffer amplifier (i.e., at the input to the voltmeter divided by the gain (i.e., Vbi≈Vp=Vout/Av). Thus, if during each measurement process (when a given set of bias conditions is applied Vd, Vg and Vext), the level of current on the probe pad region 1580 is forced to zero (i.e., Ic≈0), then the internal body voltage (Vbi) can be measured. The buffer amplifier 1598 ensures that Ic≈0 and further ensures that the amplified signal Vout is within the measurement threshold (i.e., the sense limit) of the voltmeter 1598.

Measurement circuit 1599B can only be employed at process step 1404 or 1414 if the actually measured voltage (Vp) is above the measurement threshold of the voltmeter 1598. That is, if Vp is above the measurement threshold (i.e., the sense limit) of the voltmeter 1598, no buffer amplifier is necessary. In this case, in order to ensure that Ic≈0, then a current source 1591 with zero current is attached in series with the probe pad region(s) to ensure that Vbi≈Vp.

Figure 15C:
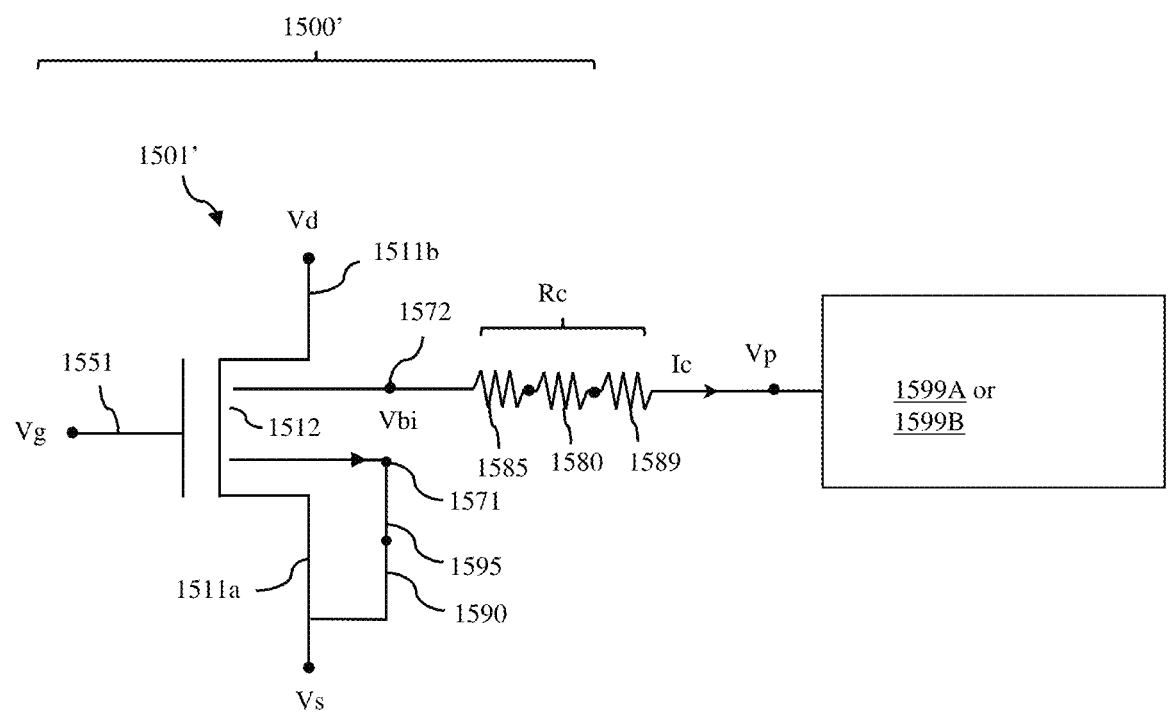

As mentioned above, the test structure 1500 shown in FIGS. 15A-15B is for a T-gate BCFET 1501. It should be understood that the measurement circuits 1599A and 1599B could be employed with any of the disclosed test structure embodiments including, but not limited to, test structure embodiments for an L-gate BCFET or an H-gate BCFET. As mentioned above, in L-gate and H-gate BCFET structures the body contact region may be shorted to the source region by a silicide layer. Thus, FIG. 15C is a schematic diagram illustrating the measurement circuits 1599A or 1599B employed for use with an alternative test structure 1500' for an L-gate or H-gate BCFET 1501').

Figure 16:
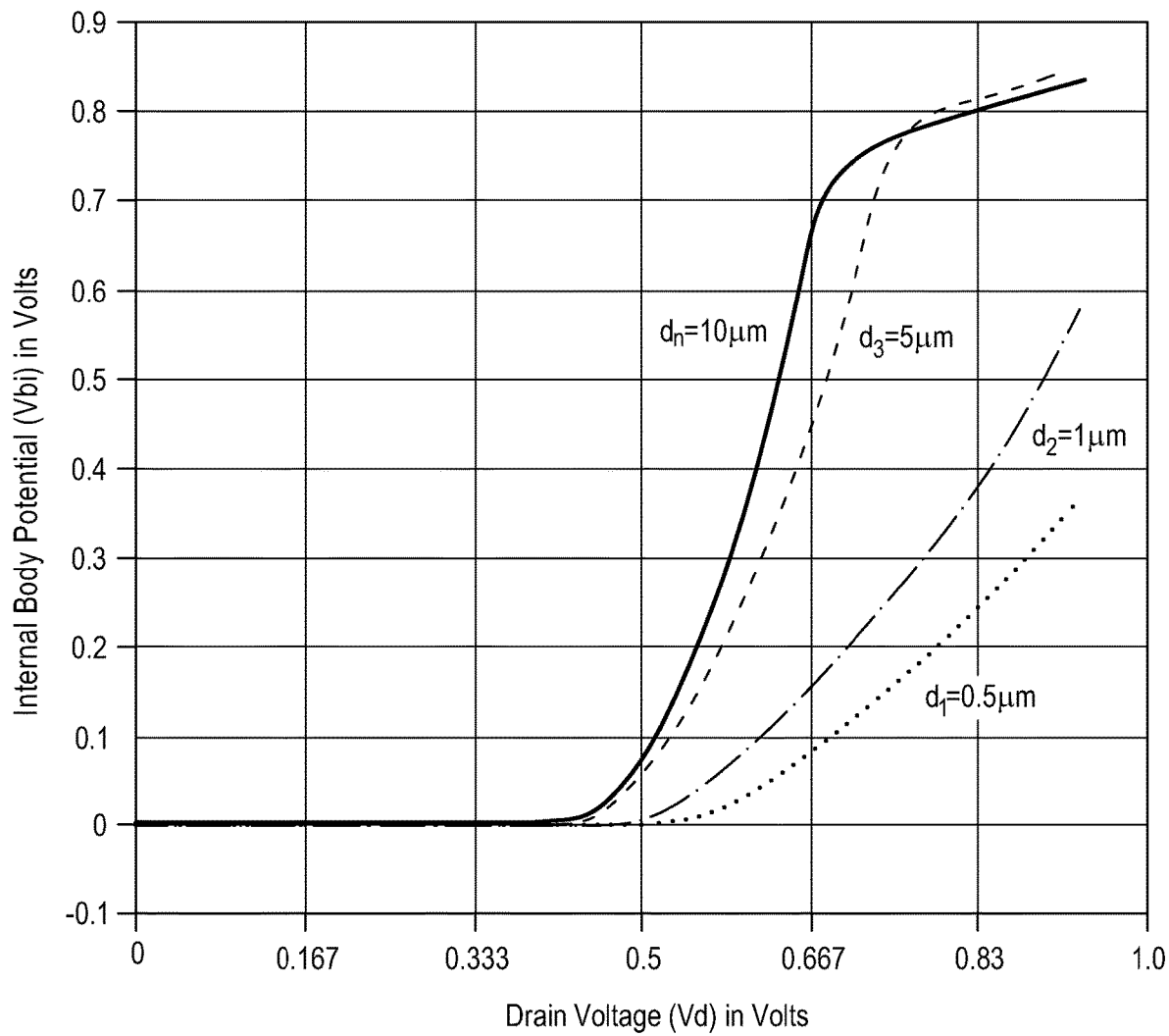
FIG. 16 is an exemplary initial graph generated at process step 1406 of FIG. 14.
Figure 17:
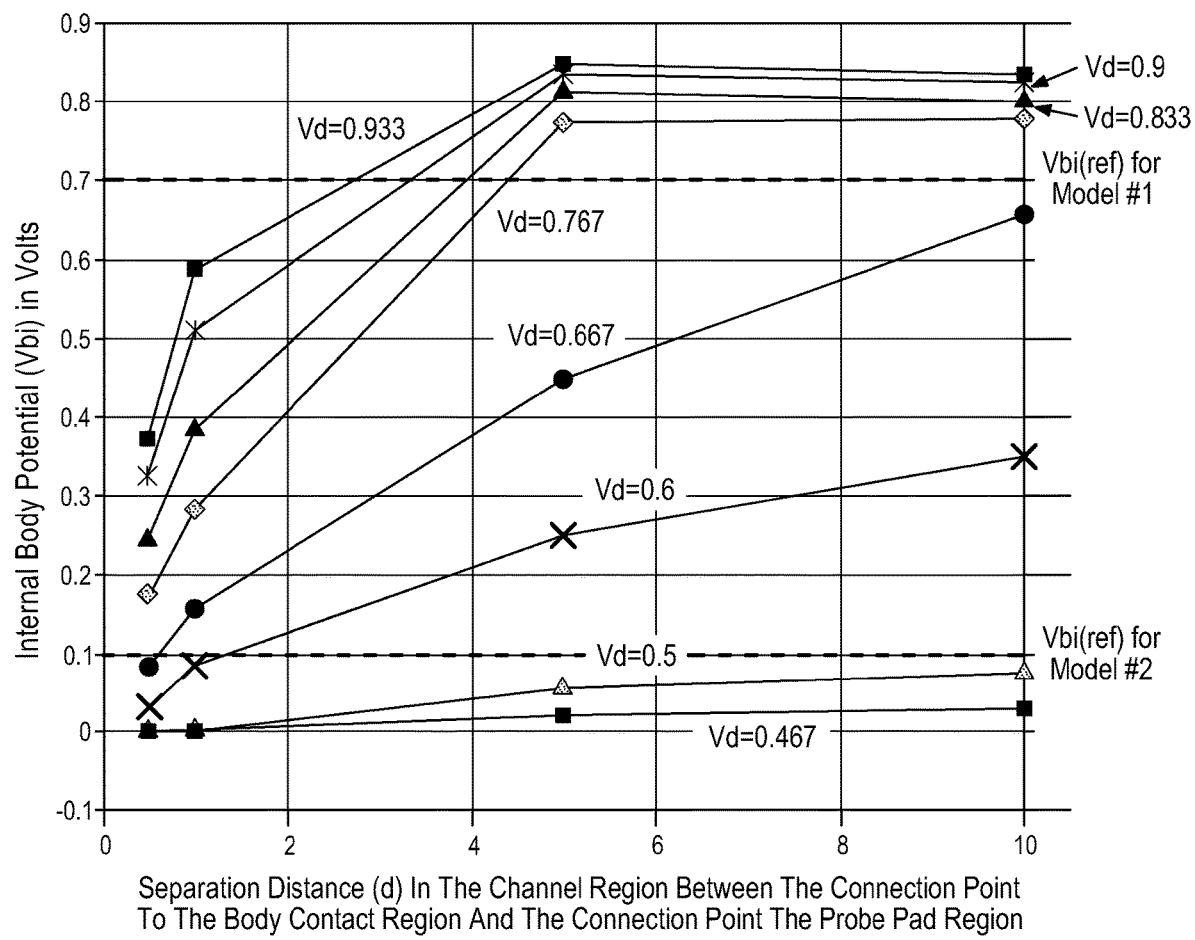
FIG. 17 is an exemplary final graph generated at process step 1422 of FIG. 14.

For method embodiments that employ multiple single-pad test structures, process step 1404 could be performed as follows. The gate and body contact bias conditions (i.e., Vg and Vext) on each single-pad test structure can be fixed and measurements could be taken from the probe pad regions on the different single-pad test structures (which have different separation distances between the first and second connection points) in response to different drain voltages (Vd). These results can be used to generate an initial graph, which is associated with specific gate and body contact bias conditions (i.e., specific Vg and Vext) and which includes multiple Vbi-Vd curves with each Vbi-Vd curve representing, for the specific gate and body contact bias conditions and for a given separation distance between first and second connection points, a relationship between changes in internal body potential (Vbi) and changes in drain voltage (Vd) (see process step 1406). For example, see the exemplary initial graph of FIG. 16 showing the relationship between Vbi and Vd for specific gate and body contact bias conditions at different separation distances $d_1$=0.5 µm (i.e., the shortest separation distance between the first and second connection points) to $d_n$=10 µm (i.e., the longest separation distance between the first and second connection points). Process steps 1404-1406 can be repeated for different specific gate and body contact bias conditions so that multiple initial graphs are generated, each associated with a different set of gate and body contact bias conditions and each having multiple Vbi-Vd curves. Developing the internal body potential profile at process step 1422 can then be performed by generating final graphs based on the initial graphs. Each final graph can be associated with a specific gate and body contact bias conditions (i.e., Vg and Vext) and can include multiple Vbi to d curves with each Vbi to d curve representing, for the specific gate and body contact bias conditions and for a given drain voltage (Vd), a relationship between the changes in the internal body potential (Vbi) and changes in the separation distance (d) between the first and second connection points. For example, see the exemplary final graph of FIG. 17 showing the relationship between Vbi and d for specific gate and body contact bias conditions at different drain voltages $Vd_1$=0.467V (i.e., the lowest Vd) to $Vd_x$=0.933V (i.e., the highest Vd).

For method embodiments that employ the multi-pad test structure, the process step of developing the internal body potential profile can similarly include generating the final graphs (e.g., as described above and illustrated in FIG. 17). However, one advantage of using the multi-pad test structure over the single-pad test structures is that the initial graphs with the Vbi-Vd curves do not need to be generated prior to generation of the final graphs. That is, the final graphs for the internal body potential profile can be generated at process step 1422 based directly on the measurements taken at process step 1414 because the Vbi measurements concurrently taken from all the probe pad regions of the multi-pad test structure for a given Vg, Vext, and Vd will provide the data necessary to complete one full curve in FIG. 17 at a time. For next full curve, Vd is changed to new value (keeping Vg, Vext fixed) and Vbi measurements are again concurrently taken from all of the probe pad regions, and so on.

Figure 18:
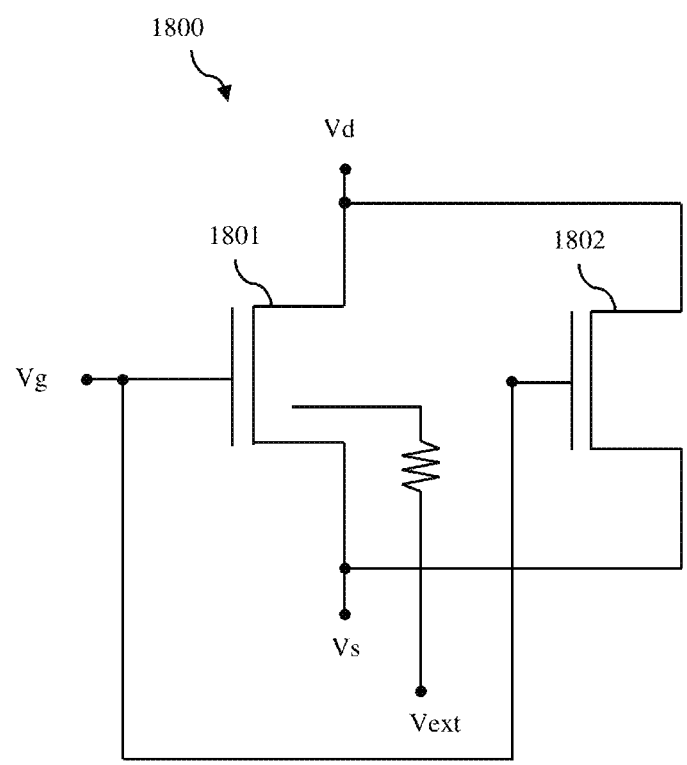
FIG. 18 is a schematic diagram illustrating a model for a BCFET, where the BCFET is represented as two devices: a body-contacted device; and a floating body device.

This internal body potential profile (including the final graphs described above for each specific combination of Vg and Vext bias conditions) can subsequently be used to generate a model for predicting the electrical characteristics of the BCFET (see process step 1424). Specifically, the model can be generated at process step 1424 such that, within the model, the BCFET is represented by a combination of two devices and, particularly, a body-contacted device proximal to the body contact region and a floating body device that is distal to the body contact region. As discussed further below, alternative model options are disclosed (e.g., one where the channel widths of the body-contacted and floating body devices are independent of the bias conditions and another where the channel widths of the body-contacted and floating body devices are dependent on the bias conditions). However, in either case, the sum of the channel widths of the body-contacted and floating body devices will be equal to the total body width of the BCFET. FIG. 18 is a schematic diagram illustrating a model 1800 for a BCFET, where the BCFET is represented as two devices: a body-contacted device 1801; and a floating body device 1802, which is connected in parallel to the body-contacted device 1801 such that the two devices have shared source, drain and gate nodes. The sum of the channel widths of the two devices will be equal to the total channel width for the BCFET itself. That is, the channel width of the BCFET ($CW_{BFET}$)×the channel width of the body-contacted device ($CW_{bc}$)+the channel width of the floating body device ($CW_{fb}$). In one embodiment of the method, a model for the BCFET can be created where $CW_{bc}$ and $CW_{fb}$ are bias-independent (referred to herein as a first model or model #1). That is, in model #1, the schematic diagram of FIG. 18 is employed and $CW_{bc}$ and $CW_{fb}$ for the devices 1801 and 1802, respectively, remain constant irrespective of application of the different sets of bias conditions in the model. That is, application of different sets of bias conditions does not result in changes in the channel widths of the two devices. In another embodiment of the method, a model for the BCFET can be created where $CW_{bc}$ and $CW_{fb}$ are bias-dependent (referred to herein as a second model or model #2). That is, in model #2, the same schematic diagram of FIG. 18 is employed but $CW_{bc}$ and $CW_{fb}$ for the devices 1801 and 1802, respectively, are varied depending upon application of the different sets of bias conditions in the model.

As mentioned above, in one embodiment of the method, the model #1 for the BCFET can be created where the channel width ($CW_{bc}$) of the body-contacted device 1801 and the channel width ($CW_{fb}$) of the floating body device 1802 are bias-independent. For example, referring to the flow diagram of FIG. 19, the ideal channel widths to be used for the body-contacted device 1801 and the floating body device 1802 can be determined based on the internal body voltage profiles (see process step 1902). For example, the ideal channel width for the floating body device can correspond to a portion of the BCFET, which has an internal body potential (Vbi) above some relatively high internal body reference voltage (Vbi(ref)), such as above 0.7V, which typically corresponds to a relatively high drain voltage when the gate voltage is at a value associated with maximum impact ionization (e.g., see Vbi(ref) for Model #1 in FIG. 17). The remaining portion of the BCFET can be assumed to be in the body-contacted conditions. Thus, given the exemplary internal body voltage (Vbi) versus separation distance graph of FIG. 17, the channel width ($CW_{bc}$) of the body-contacted device 1801 can be determined to be approximately 4 µm and the channel width ($CW_{fb}$) for the floating body device 1802 can be determined to be approximately 6 µm. Discrete models can subsequently be generated for the body-contacted device 1801 and the floating body device 1802 (see process steps 1904-1910). Specifically, a model for a body contact device 1801, which has the channel width that was previously determined at process step 1902, can be created by matching the BCFET device data until the onset of a kink in the Gds or Ids to Vd curve (see process step 1904). Next, device data for the floating body device 1802, which has the channel width that was also previously determined at process step 1902, an be acquired by subtracting out the model for the body-contacted device 1801, which was created at process step 1904, from the hardware data (see process step 1906). A model for the floating body device can then be determined and adjusted to match the device data acquired for the floating body device at process step 1906 (see process step 1908-1910). Finally, the body contact device model and the floating body device model can be associated with the devices 1801 and 1802, respectively, in the schematic diagram of FIG. 18, thereby creating the model for the BCFET, where the channel widths of the devices 1801-1802 are independent of the bias conditions.

Figure 20A:
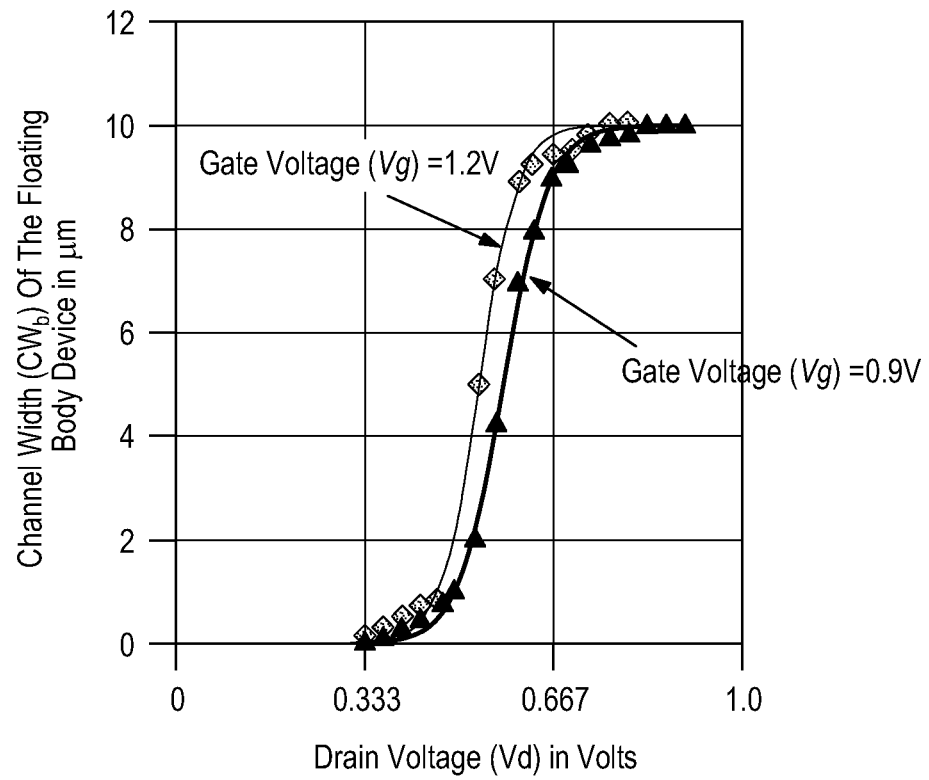
FIGS. 20A and 20B are graphs illustrating one technique for calculating bias-dependent channel widths for the body-contacted and floating body devices of the model developed according to the flow diagram of FIG. 19.
Figure 20B:
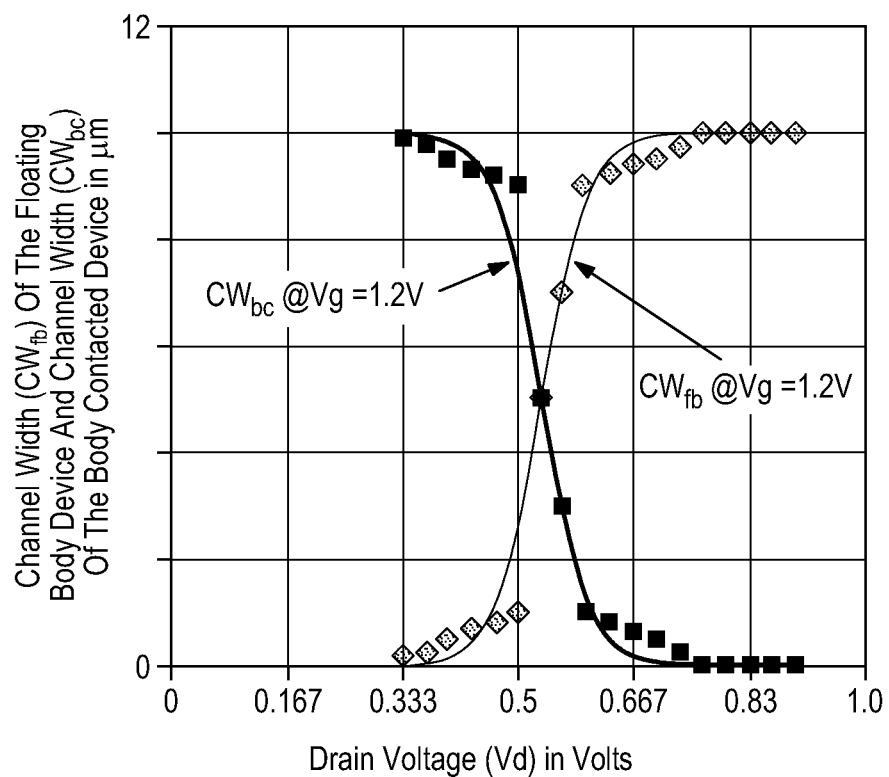

As mentioned above, in another embodiment of the method, the model #2 for the BCFET can be generated where the channel width ($CW_{bc}$) of the body-contacted device 1801 and the channel width ($CW_{fb}$) of the floating body device 1802 are bias-dependent. In this case, at process step 1902 of FIG. 19, the following equation for formulating the channel width ($CW_{fb}$) of the floating body device 1802 as a function of specific gate and drain bias conditions (i.e., a specific Vg and Vd combination) can be employed assuming that the body of the BCFET is beginning to float when Vbi crosses some relatively low internal body reference voltage (Vbi(ref)) (e.g., below 0.1V) (e.g., see Vbi(ref) for Model #1 in FIG. 17):

$$CW_{fb}(V_d, Vg) = \left( \frac{1}{1 + \exp\left(-\left(\frac{V_d - f_1(Vg)}{f_2(Vg)}\right)\right)} \right) \quad (1)$$

where f1(Vg) and f2(Vg) are two monotonically increasing functions of Vg (e.g., as illustrated in the graph of FIG. 20A). Then, the channel width ($CW_{bc}$) of the body-contacted device 1801 can be formulated as the difference between the total channel width of the BCFET ($CW_{BCFET}$) and the channel width ($CW_{fb}$) of the floating body device 1802. That is, as illustrated in the graph of FIG. 20B, $$CW_{bc} = CW_{BCFET} - CW_{fb}. \quad (2)$$

Figure 19:
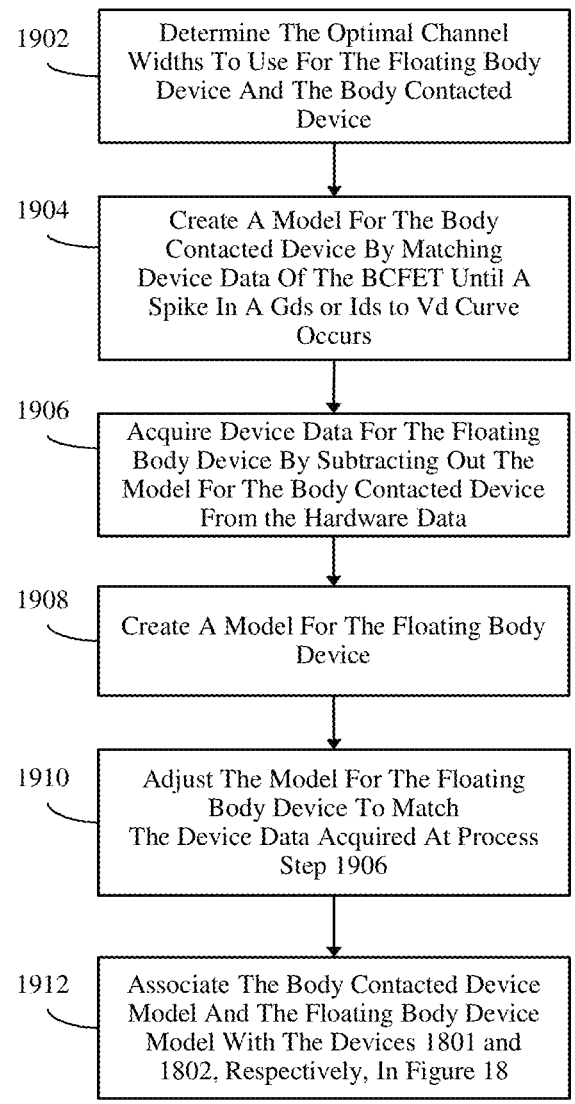
FIG. 19 is a flow diagram for developing a model for a BCFET, where the BCFET is represented as two devices: a body-contacted device; and a floating body device.

Process steps 1904 through 1912 of FIG. 19 can then be performed, in essentially the same manner as described above, with respect the body-contacted and floating body devices having the bias-dependent channel widths identified at process step 1904. The process steps 1902-1912 can be iteratively repeated for different Vg and Vd combinations.

Referring again to the flow diagram of FIG. 14, once the model for the BCFET is generated, the model can be employed during integrated circuit (IC) design to ensure that a product, which incorporates such BCFETs, will perform as expected (see process step 1426).

It should be understood that in the structures and methods described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and gallium nitride-based semiconductor materials. A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity or silicon (Si) to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    providing multiple different instances of a test structure, wherein each of the multiple different instances of the test structure comprises:
        a channel region;
        a source region adjacent to a first side of the channel region;
        a drain region adjacent to a second side of the channel region opposite the first side;
        a body contact region electrically connected to a first connection point in the channel region and electrically isolated from the source region and the drain region; and
        a probe pad region electrically connected to a second connection point in the channel region and electrically isolated from the source region and the drain region, and
    wherein, in the multiple different instances of the test structure, the first connection point and the second connection point are separated by different separation distances, respectively;
    applying different sets of bias conditions to each instance of the test structure;
    measuring a voltage level on the probe pad region of each instance of the test structure in response to application of each set of bias conditions, wherein the voltage level on the probe pad region is indicative of an internal body potential of the channel region at the second connection point; and
    based on results of the measuring, developing an internal body potential profile for a body-contacted field effect transistor, wherein the profile indicates expected internal body potential variations of the body-contacted field effect transistor as a function of both the different separation distances and different drain voltages.

2. The method of claim 1,
    wherein the developing of the internal body potential profile comprises generating initial graphs, where each initial graph is associated with specific gate, source and body contact bias conditions and comprises multiple first curves with each first curve representing, for the specific gate, source and body contact bias conditions and for a given separation distance between first and second connection points, a relationship between changes in internal body potential and changes in drain voltage, and
    wherein the developing of the internal body potential profile further comprises generating final graphs, where each final graph is associated with the specific gate, source and body contact bias conditions and comprises multiple second curves with each second curve representing, for the specific gate, source and body contact bias conditions and for a given drain voltage, a relationship between the changes in the internal body potential and changes in the separation distance between the first and second connection points.

3. The method of claim 1, further comprising, based on the profile, generating a model to predict electrical characteristics of the body-contacted field effect transistor,
    wherein the body-contacted field effect transistor has a total channel width,
    wherein, within the model, the body-contact field effect transistor is represented by a combination of body-contacted and floating body devices, and
    wherein a sum of channel widths of the body-contacted and floating body devices is equal to the total channel width.

4. The method of claim 3, wherein, within the model, the channel widths of the body-contacted and floating body devices remain constant irrespective of application of the different sets of bias conditions.

5. The method of claim 3, wherein, within the model, the channel widths of the body-contacted and floating body devices vary as a function of application of the different sets of bias conditions.

6. The method of claim 3, further comprising employing the model during integrated circuit design.

7. A method comprising:
    applying different sets of bias conditions to a test structure, wherein the test structure comprises:
        a channel region;
        a source region adjacent to a first side of the channel region;
        a drain region adjacent to a second side of the channel region opposite the first side;

a body contact region electrically connected to a first connection point in the channel region and electrically isolated from the source region and the drain region; and multiple probe pad regions electrically connected to corresponding second connection points in the channel region and electrically isolated from the source region and the drain region, wherein the corresponding second connection points are separated from the first connection point by different separation distances, respectively;

measuring voltage levels on the multiple probe pad regions in response to application of each set of bias conditions, wherein voltage levels on the probe pad regions are indicative of internal body potentials at the corresponding second connection points; and based on results of the measuring, developing an internal body potential profile for a body-contacted field effect transistor, wherein the profile indicates expected internal body potential variations of the body-contacted field effect transistor as a function of both the different separation distances and different drain voltages.

8. The method of claim 7,
wherein the developing of the internal body potential profile further comprises generating graphs, where each graph is associated with specific gate, source and body contact bias conditions and comprises multiple curves with each curve representing, for the specific gate, source and body contact bias conditions and for a given drain voltage, a relationship between changes in the internal body potential and changes in separation distance between the first and second connection points.

9. The method of claim 7, further comprising, based on the profile, generating a model to predict electrical characteristics of the body-contacted field effect transistor,
wherein the body-contacted field effect transistor has a total channel width,
wherein, within the model, the body-contact field effect transistor is represented by a combination of body-contacted and floating body devices, and
wherein a sum of channel widths of the body-contacted and floating body devices is equal to the total channel width.

10. The method of claim 9, wherein, within the model, the channel widths of the body-contacted and floating body devices remain constant irrespective of application of the different sets of bias conditions.

11. The method of claim 9, wherein, within the model, the channel widths of the body-contacted and floating body devices vary as a function of application of the different sets of bias conditions.

12. A test structure for a body-contacted field effect transistor, the test structure comprising:
a channel region;
a source region adjacent to a first side of the channel region;
a drain region adjacent to a second side of the channel region opposite the first side;
a body contact region electrically connected to a first connection point in the channel region and electrically isolated from the source region and the drain region; and
a probe pad region electrically connected to a second connection point in the channel region and electrically isolated from the source region and the drain region, wherein the probe pad region is adapted to output an output voltage and to be electrically connected to a voltmeter that measures the output voltage and wherein the output voltage is indicative of an internal body potential of the channel region at the second connection point.

13. The test structure of claim 12,
wherein the test structure is a single-pad test structure comprising a single probe pad region,
wherein the first connection point is at a first end of the channel region,
wherein the second connection point is at a second end of the channel region opposite the first end such that a separation distance between the first connection point and the second connection point is equal to a channel width of the body-contacted field effect transistor,
wherein the test structure further comprises multiple channel link-up regions comprising:
a first channel link-up region that extends laterally from the first connection point at the first end of the channel region to the body contact region; and
a second channel link-up region that extends laterally from the second connection point at the second end of the channel region to the probe pad region,
wherein the channel region, the first channel link-up region, the second channel link-up region, the body contact region and the probe pad region have a first type conductivity, and
wherein the source region and the drain region have a second type conductivity that is different from the first type conductivity.

14. The test structure of claim 13, wherein the test structure further comprises a gate structure comprising:
a main portion adjacent to the channel region;
a first extension portion adjacent to the first channel link-up region; and
a second extension portion adjacent to the second channel link-up region.

15. The test structure of claim 14,
wherein the second channel link-up region has a length that is greater than a length of the channel region, and
wherein the second extension portion of the gate structure has a length that is greater than a length of the main portion of the gate structure, completely traverses the second channel link-up region, and further extends onto adjacent isolation regions.

16. The test structure of claim 14,
wherein the second extension portion of the gate structure has a length that is equal to a length of the main portion of the gate structure,
wherein the probe pad region laterally surrounds three sides of the second channel link-up region so as to also be immediately adjacent to the source region and the drain region, and
wherein, in areas adjacent to the source region and the drain region, a top surface of the probe pad region is devoid of silicide to prevent shorting between the probe pad region and the source region and the drain region.

17. The test structure of claim 14,
wherein the second channel link-up region has a length that is less than or equal to a length of the channel region, and
wherein the second extension portion of the gate structure has a length that is less than or equal to a length of the main portion of the gate structure, completely traverses the second channel link-up region, and further extends onto adjacent isolation regions.

18. The test structure of claim 12,
wherein the channel region has a first end and a second end opposite the first end,
wherein the test structure comprises a multi-pad test structure comprising multiple probe pad regions and multiple channel link-up regions comprising:
   a first channel link-up region that extends laterally from the first connection point at the first end of the channel region to the body contact region; and
   second channel link-up regions that extend laterally from second connection points along a width of the channel region to the probe pad regions, respectively,
wherein the channel region, the multiple channel link-up regions, the body contact region and the multiple probe pad regions have a first type conductivity, and
wherein the source region and the drain region have a second type conductivity that is different from the first type conductivity.

19. The test structure of claim 18, wherein the probe pad regions are spaced along the width of the channel region between the first end and the second end and wherein successive ones of the probe pad regions are adjacent to opposite sides of the channel region.

20. The test structure of claim 12,
wherein the body contact region is within the source region,
wherein the first connection point is at the first side of the channel region between the first end and the second end,
wherein the test structure comprises two probe pad regions electrically connected to two second connection points in the channel region at second connection points at the first end and the second end, respectively,
wherein the test structure further comprises multiple channel link-up regions comprising:
   a first channel link-up region that extends laterally from the first connection point to the body contact region; and
   second channel link-up regions that extend laterally from the second connection points to the probe pad regions,
wherein the channel region, the channel link-up regions, the body contact region and the probe pad regions have a first type conductivity, and
wherein the source region and the drain region have a second type conductivity that is different from the first type conductivity.

* * * * *